United States Patent
Kim et al.

(10) Patent No.: US 12,488,766 B2
(45) Date of Patent: Dec. 2, 2025

(54) GATE DRIVER

(71) Applicant: Samsung Display Co., Ltd., Yongin-Si (KR)

(72) Inventors: Minjoo Kim, Yongin-si (KR); Minwoo Byun, Yongin-si (KR); Kyonghwan Oh, Yongin-si (KR); Yang-Hwa Choi, Yongin-si (KR); Donghwan Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 7 days.

(21) Appl. No.: 18/675,139

(22) Filed: May 28, 2024

(65) Prior Publication Data

US 2025/0104596 A1 Mar. 27, 2025

(30) Foreign Application Priority Data

Sep. 26, 2023 (KR) .................... 10-2023-0129251
Oct. 24, 2023 (KR) .................... 10-2023-0143280

(51) Int. Cl.
*G09G 3/36* (2006.01)
*G09G 3/3266* (2016.01)
*G11C 19/28* (2006.01)
*H03K 3/012* (2006.01)

(52) U.S. Cl.
CPC ......... *G09G 3/3677* (2013.01); *G09G 3/3266* (2013.01); *G11C 19/28* (2013.01); *H03K 3/012* (2013.01); *G09G 2310/0267* (2013.01); *G09G 2330/021* (2013.01)

(58) Field of Classification Search
CPC ............... G09G 3/3266; G09G 3/3677; G09G 2310/0267; G11C 19/28
See application file for complete search history.

(56) References Cited

U.S. PATENT DOCUMENTS

| | | | |
|---|---|---|---|
| 11,315,495 B2 * | 4/2022 | Kim | G09G 3/3677 |
| 11,315,497 B2 | 4/2022 | Yu et al. | |
| 11,348,506 B1 | 5/2022 | Kim | |
| 2007/0171115 A1 | 7/2007 | Kim et al. | |
| 2017/0294165 A1 * | 10/2017 | Park | G09G 3/3266 |
| 2023/0215316 A1 | 7/2023 | Baek et al. | |
| 2024/0096276 A1 * | 3/2024 | Byun | G09G 3/32 |
| 2024/0312391 A1 * | 9/2024 | Kim | G09G 3/20 |
| 2025/0104650 A1 * | 3/2025 | Byun | G09G 3/3266 |

FOREIGN PATENT DOCUMENTS

| | | |
|---|---|---|
| KR | 10-1115026 B1 | 3/2012 |
| KR | 10-2021-0083620 A | 7/2021 |
| KR | 10-2021-0085236 A | 7/2021 |
| KR | 10-2022-0076841 A | 6/2022 |
| KR | 10-2023-0102215 A | 7/2023 |

\* cited by examiner

*Primary Examiner* — Patrick O Neill
(74) *Attorney, Agent, or Firm* — Innovation Counsel LLP

(57) ABSTRACT

A gate driver includes a plurality of stages. At least one of the stages includes a control circuit configured to control a first control node in response to a first carry clock signal, a node separation transistor connected between the first control node and a second control node, a carry output circuit configured to output a carry signal in response to a voltage of the second control node, and a plurality of gate output circuits configured to output a plurality of gate signals having different timings in response to the voltage of the second control node.

21 Claims, 12 Drawing Sheets

GATE DRIVER

This application claims priority to Korean Patent Application No. 10-2023-0129251 filed on Sep. 26, 2023, and Korean Patent Application No. 10-2023-0143280 filed on Oct. 24, 2023, and all the benefits accruing therefrom under 35 U.S.C. § 119, the content of which in its entirety is herein incorporated by reference.

BACKGROUND

1. Field

Embodiments of the present inventive concept relate to a gate driver and a method of driving the same. More particularly, embodiments of the present inventive concept relate to a gate driver with reduced dead space and power consumption.

2. Description of the Related Art

Generally, a display device may include a display panel and a display panel driver. The display panel may include gate lines, data lines and pixels. The display panel driver may include a gate driver for providing a gate signal to the gate lines, a data driver for providing a data voltage to the data lines and a driving controller for controlling the gate driver and the data driver.

When the gate driver is integrated into the display panel, a number of transistors and signal wires of the gate driver may affect dead space and power consumption of the display device. For example, when the number of transistors and signal wires of the gate driver is large, the dead space and power consumption of the display device increase.

SUMMARY

Embodiments of the present inventive concept provide a gate driver for reducing dead space and power consumption.

In an embodiment of a gate driver according to the present inventive concept, the gate driver comprises a plurality of stages. At least one of the stages includes a control circuit configured to control a first control node in response to a first carry clock signal, a node separation transistor connected between the first control node and a second control node, a carry output circuit configured to output a carry signal in response to a voltage of the second control node, and a plurality of gate output circuits configured to output a plurality of gate signals having different timings in response to the voltage of the second control node.

In an embodiment, the node separation transistor may separate the first control node and the second control node to control a voltage of the first control node.

In an embodiment, the node separation transistor may include a gate electrode configured to receive a high gate voltage, a first electrode connected to the first control node, and a second electrode connected to the second control node.

In an embodiment, the control circuit may include an input circuit configured to provide an input signal to the first control node in response to the first carry clock signal, a first selection circuit configured to provide a first selection signal to a first inversion control node in response to the first selection signal, and a first inversion control circuit configured to control a voltage of the first inversion control node based on a voltage of the first control node.

In an embodiment, the input circuit may include a first transistor including a gate electrode configured to receive the first carry clock signal, a first electrode configured to receive the input signal, and a second electrode connected to the first control node, the first selection circuit may include a fourth transistor including a gate electrode configured to receive the first selection signal, a first electrode configured to receive the first selection signal, and a second electrode, a fifth transistor including a gate electrode connected to the second electrode of the fourth transistor, a first electrode configured to receive the first selection signal, and a second electrode connected to the first inversion control node, a sixth transistor including a gate electrode connected to the first control node, a first electrode configured to receive a first low gate voltage, and a second electrode connected to the gate electrode of the fifth transistor, and a first capacitor including a first electrode connected to the gate electrode of the fifth transistor and a second electrode connected to the first inversion control node, and the first inversion control circuit may include a seventh transistor including a gate electrode connected to the first control node, a first electrode configured to receive a second low gate voltage, and a second electrode connected to the first inversion control node.

In an embodiment, the control circuit may further include a second selection circuit configured to provide a second selection signal to a second inversion control node in response to the second selection signal, and a second inversion control circuit configured to control a voltage of the second inversion control node based on the voltage of the first control node.

In an embodiment, the second selection circuit may include an eighth transistor including a gate electrode configured to receive the second selection signal, a first electrode configured to receive the second selection signal, and a second electrode, a ninth transistor including a gate electrode connected to the second electrode of the eighth transistor, a first electrode configured to receive the second selection signal, and a second electrode connected to the second inversion control node, a tenth transistor including a gate electrode connected to the first control node, a first electrode configured to receive a first low gate voltage, and a second electrode connected to the gate electrode of the ninth transistor, and a second capacitor including a first electrode connected to the gate electrode of the ninth transistor and a second electrode connected to the second inversion control node, and the second inversion control circuit may include an 11th transistor including a gate electrode connected to the first control node, a first electrode configured to receive a second low gate voltage, and a second electrode connected to the second inversion control node.

In an embodiment, the control circuit may further include a second transistor including a gate electrode configured to receive a reset signal, a first electrode configured to receive a first low gate voltage, and a second electrode connected to the first control node and
  a third transistor including a gate electrode connected to the first control node, a first electrode configured to receive a high gate voltage, and a second electrode.

In an embodiment, the carry output circuit may include a 15th transistor including a gate electrode connected to the second control node, a first electrode configured to receive a second carry clock signal, and a second electrode connected to a carry output node through which the carry signal is output, a 16th transistor including a gate electrode connected to a first inversion control node, a first electrode configured to receive a second low gate voltage, and a second electrode connected to the carry output node, a 12th transistor including a gate electrode configured to receive the second carry clock signal, a first electrode connected to the first control node, and a second electrode, a 13th transistor including a gate electrode connected to the first inversion control node, a first electrode connected to the second electrode of the 12th transistor, and a second electrode connected to the carry output node, and a third capacitor including a gate electrode connected to the second control node and a second electrode connected to the carry output node.

In an embodiment, the carry output circuit may further include a 17th transistor including a gate electrode connected to the second inversion control node, a first electrode configured to receive the second low gate voltage, and a second electrode connected to the carry output node, and a 14th transistor including a gate electrode connected to the second inversion control node, a first electrode connected to the second electrode of the 12th transistor, and a second electrode connected to the carry output node.

In an embodiment, the gate output circuits may include a first gate output circuit configured to output a first gate signal in response to the voltage of the second control node, a second gate output circuit configured to output a second gate signal in response to the voltage of the second control node, a third gate output circuit configured to output a third gate signal in response to the voltage of the second control node, and a fourth gate output circuit configured to output a fourth gate signal in response to the voltage of the second control node, the first gate output circuit may include a 18Ath transistor including a gate electrode connected to the second control node, a first electrode configured to receive a second clock signal, and a second electrode connected to a first gate output node through which the first gate signal is output, and a 19Ath transistor including a gate electrode connected to a first inversion control node, a first electrode configured to receive a first low gate voltage, and a second electrode connected to the first gate output node, the second gate output circuit may include a 18Bth transistor including a gate electrode connected to the second control node, a first electrode configured to receive a third clock signal, and a second electrode connected to a second gate output node through which the second gate signal is output, and a 19Bth transistor including a gate electrode connected to the first inversion control node, a first electrode configured to receive the first low gate voltage, and a second electrode connected to the second gate output node, the third gate output circuit may include a 18Cth transistor including a gate electrode connected to the second control node, a first electrode configured to receive a fourth clock signal, and a second electrode connected to a third gate output node through which the third gate signal is output, and a 19Cth transistor including a gate electrode connected to the first inversion control node, a first electrode configured to receive the first low gate voltage, and a second electrode connected to the third gate output node, and the fourth gate output circuit may include a 18Dth transistor including a gate electrode connected to the second control node, a first electrode configured to receive a fifth clock signal, and a second electrode connected to a fourth gate output node through which the fourth gate signal is output, and a 19Dth transistor including a gate electrode connected to the first inversion control node, a first electrode configured to receive the first low gate voltage, and a second electrode connected to the fourth gate output node.

In an embodiment, the first gate output circuit may further include a 20Ath transistor including a gate electrode connected to a second inversion control node, a first electrode configured to receive the first low gate voltage, and a second electrode connected to the first gate output node, the second gate output circuit may further include a 20Bth transistor including a gate electrode connected to the second inversion control node, a first electrode configured to receive the first low gate voltage, and a second electrode connected to the second gate output node, the third gate output circuit may further include a 20Cth transistor including a gate electrode connected to the second inversion control node, a first electrode configured to receive the first low gate voltage, and a second electrode connected to the third gate output node, and the fourth gate output circuit may further include a 20Dth transistor including a gate electrode connected to the second inversion control node, a first electrode configured to receive the first low gate voltage, and a second electrode connected to the fourth gate output node.

In an embodiment of a gate driver according to the present inventive concept, the gate driver comprises a plurality of stages. At least one of the stages includes a control circuit configured to control a first control node in response to a first clock signal, a node separation transistor connected between the first control node and a second control node, a carry output circuit configured to output a carry signal in response to a voltage of the second control node, and a plurality of gate output circuits configured to output a plurality of gate signals having different timings in response to the voltage of the second control node.

In an embodiment, the node separation transistor may separate the first control node and the second control node to control a voltage of the first control node.

In an embodiment, the node separation transistor may include a gate electrode configured to receive a high gate voltage, a first electrode connected to the first control node, and a second electrode connected to the second control node.

In an embodiment, the control circuit may include an input circuit configured to provide an input signal to the first control node in response to the first clock signal, a first selection circuit configured to provide the first selection signal to a first inversion control node in response to a first selection signal, and a first inversion control circuit configured to control a voltage of the first inversion control node based on a voltage of the first control node, the input circuit may include a first transistor including a gate electrode configured to receive the first clock signal, a first electrode configured to receive the input signal, and a second electrode connected to the first control node, the first selection circuit may include a fourth transistor including a gate electrode configured to receive the first selection signal, a first electrode configured to receive the first selection signal, and a second electrode, a fifth transistor including a gate electrode connected to the second electrode of the fourth transistor, a first electrode configured to receive the first selection signal, and a second electrode, a sixth transistor including a gate electrode connected to the first control node, a first electrode configured to receive a first low gate voltage, and a second electrode connected to the gate electrode of the fifth transistor, and a first capacitor including a first electrode connected to the gate electrode of the fifth transistor and a second electrode connected to the first inversion control node, and the first inversion control circuit may include a seventh transistor including a gate electrode connected to the first control node, a first electrode configured to receive a second low gate voltage, and a second electrode connected to the first inversion control node.

In an embodiment, the control circuit may further include a second selection circuit configured to provide a second selection signal to a second inversion control node in response to the second selection signal, and a second inversion control circuit configured to control a voltage of the second inversion control node based on the voltage of the first control node, the second selection circuit may include an eighth transistor including a gate electrode configured to receive the second selection signal, a first electrode configured to receive the second selection signal, and a second electrode, a ninth transistor including a gate electrode connected to the second electrode of the eighth transistor, a first electrode configured to receive the second selection signal, and a second electrode, a tenth transistor including a gate electrode connected to the first control node, a first electrode configured to receive a first low gate voltage, and a second electrode connected to the gate electrode of the ninth transistor, and a second capacitor including a first electrode connected to the gate electrode of the ninth transistor and a second electrode connected to the second inversion control node, and the second inversion control circuit may include an 11th transistor including a gate electrode connected to the first control node, a first electrode configured to receive a second low gate voltage, and a second electrode connected to the second inversion control node.

In an embodiment, the carry output circuit may include a 15th transistor including a gate electrode connected to the second control node, a first electrode configured to receive a fourth clock signal, and a second electrode connected to a carry output node through which the carry signal is output, a 16th transistor including a gate electrode connected to the first inversion control node, a first electrode configured to receive a second low gate voltage, and a second electrode connected to the carry output node, a 12th transistor including a gate electrode configured to receive the fourth clock signal, a first electrode connected to the first control node, and a second electrode, a 13th transistor including a gate electrode connected to the first inversion control node, a first electrode connected to the second electrode of the 12th transistor, and a second electrode connected to the carry output node, and a third capacitor including a gate electrode connected to the second control node and a second electrode connected to the carry output node.

In an embodiment, the carry output circuit may further include a 17th transistor including a gate electrode connected to the second inversion control node, a first electrode configured to receive the second low gate voltage, and a second electrode connected to the carry output node, and a 14th transistor including a gate electrode connected to the second inversion control node, a first electrode connected to the second electrode of the 12th transistor, and a second electrode connected to the carry output node.

In an embodiment, the gate output may circuits include a first gate output circuit configured to output a first gate signal in response to the voltage of the second control node, a second gate output circuit configured to output a second gate signal in response to the voltage of the second control node, and a third gate output circuit configured to output a third gate signal in response to the voltage of the second control node, the first gate output circuit may include a 18Ath transistor including a gate electrode connected to the second control node, a first electrode configured to receive a second clock signal, and a second electrode connected to a first gate output node through which the first gate signal is output, and a 19Ath transistor including a gate electrode connected to a first inversion control node, a first electrode configured to receive a first low gate voltage, and a second electrode connected to the first gate output node, the second gate output circuit may include a 18Bth transistor including a gate electrode connected to the second control node, a first electrode configured to receive a third clock signal, and a second electrode connected to a second gate output node through which the second gate signal is output, and a 19Bth transistor including a gate electrode connected to the first inversion control node, a first electrode configured to receive the first low gate voltage, and a second electrode connected to the second gate output node, and the third gate output circuit may include a 18Cth transistor including a gate electrode connected to the second control node, a first electrode configured to receive a fourth clock signal, and a second electrode connected to a third gate output node through which the third gate signal is output, and a 19Cth transistor including a gate electrode connected to the first inversion control node, a first electrode configured to receive the first low gate voltage, and a second electrode connected to the third gate output node.

In an embodiment, the first gate output circuit may further include a 20Ath transistor including a gate electrode connected to a second inversion control node, a first electrode configured to receive the first low gate voltage, and a second electrode connected to the first gate output node, the second gate output circuit may further include a 20Bth transistor including a gate electrode connected to the second inversion control node, a first electrode configured to receive the first low gate voltage, and a second electrode connected to the second gate output node, and the third gate output circuit may further include a 20Cth transistor including a gate electrode connected to the second inversion control node, a first electrode configured to receive the first low gate voltage, and a second electrode connected to the third gate output node.

According to the gate driver, since the gate output circuits may share the control circuit, the node separation transistor, and the carry output circuit, the number of transistors and signal wires in each stage may be reduced, and dead space and power consumption of the display device may be reduced.

Additionally, since each stage includes the node separation transistor which separates the first control node and the second control node, reliability of the display device may be improved.

BRIEF DESCRIPTION OF THE DRAWINGS

The above and other features of embodiments of the present inventive concept will become more apparent by describing in detailed embodiments thereof with reference to the accompanying drawings, in which.

DETAILED DESCRIPTION OF THE EMBODIMENTS

Hereinafter, the present disclosure will be described in more detail with reference to the accompanying drawings.

Figure 1:
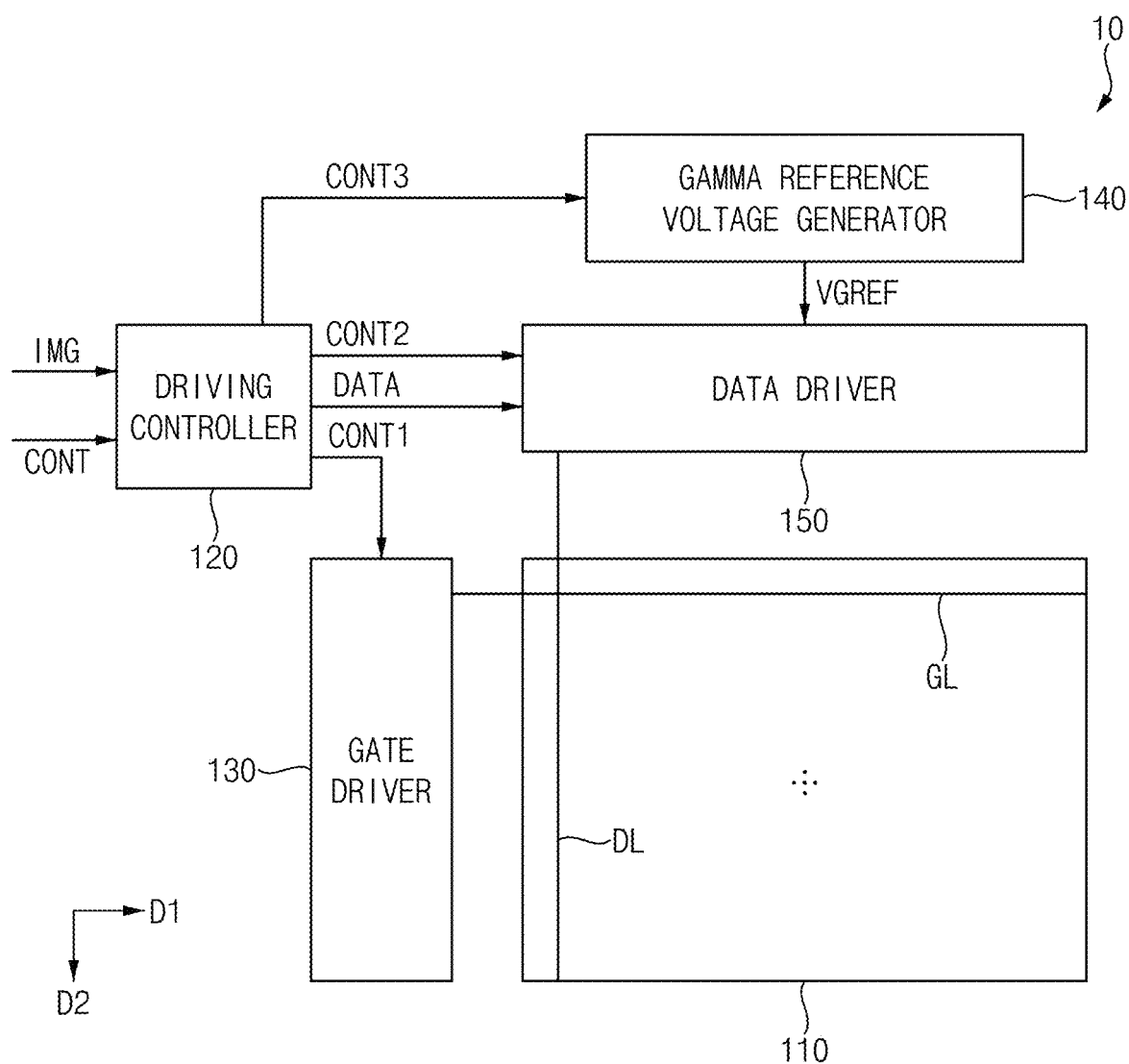
FIG. 1 is a block diagram illustrating a display device according to embodiments of the present inventive concept.

FIG. 1 is a block diagram illustrating a display device 10 according to embodiments of the present inventive concept.

Referring to FIG. 1, a display device 10 may include a display panel 110 and a display panel driver. The display panel driver may include a driving controller 120, a gate driver 130, a gamma reference voltage generator 140 and a data driver 150.

The display panel 110 may include a display area for displaying an image and a peripheral area disposed adjacent to the display area.

The display panel 110 may include gate lines GL, data lines DL and pixels electrically connected to the gate lines GL and the data lines DL, respectively. The gate lines GL may extend in a first direction D1, the data lines DL may extend in a second direction D2 crossing the first direction D1.

The driving controller 120 may receive input image data IMG and an input control signal CONT from an external device (not shown). For example, the input image data IMG may include red image data, green image data and blue image data. The input image data IMG may include white image data. The input image data IMG may include magenta image data, yellow image data, and cyan image data. The input control signal CONT may include a master clock signal and a data enable signal. The input control signal CONT may further include a vertical synchronization signal and a horizontal synchronization signal.

The driving controller 120 may generate a first control signal CONT1, a second control signal CONT2, a third control signal CONT3 and a data signal DATA based on the input image data IMG and the input control signal CONT.

The driving controller 120 may generate the first control signal CONT1 for controlling an operation of the gate driver 130 based on the input control signal CONT, and output the first control signal CONT1 to the gate driver 130. The first control signal CONT1 may include a vertical start signal and a gate clock signal.

The driving controller 120 may generate the second control signal CONT2 for controlling an operation of the data driver 150 based on the input control signal CONT, and output the second control signal CONT2 to the data driver 150. The second control signal CONT2 may include a horizontal start signal and a load signal.

The driving controller 120 may generate a data signal DATA based on the input image data IMG. The driving controller 120 may output the data signal DATA to the data driver 150.

The driving controller 120 may generate the third control signal CONT3 for controlling an operation of the gamma reference voltage generator 140 based on the input control signal CONT, and output the third control signal CONT3 to the gamma reference voltage generator 140.

The gate driver 130 may generate gate signals for driving the gate lines GL in response to the first control signal CONT1 received from the driving controller 120. The gate driver 130 may output the gate signals to the gate lines GL.

The gamma reference voltage generator 140 may generate a gamma reference voltage VGREF in response to the third control signal CONT3 received from the driving controller 120. The gamma reference voltage generator 140 may provide the gamma reference voltage VGREF to the data driver 150. The gamma reference voltage VGREF may have a value corresponding to each data signal DATA.

The gamma reference voltage generator 140 may be disposed in the driving controller 120 or may be disposed in the data driver 150.

The data driver 150 may receive the second control signal CONT2 and the data signal DATA from the driving controller 120, and receive the gamma reference voltage VGREF from the gamma reference voltage generator 140. The data driver 150 may convert the data signal DATA into a data voltage having an analog type using the gamma reference voltage VGREF. The data driver 150 may output the data voltage to the data line DL.

Figure 2:
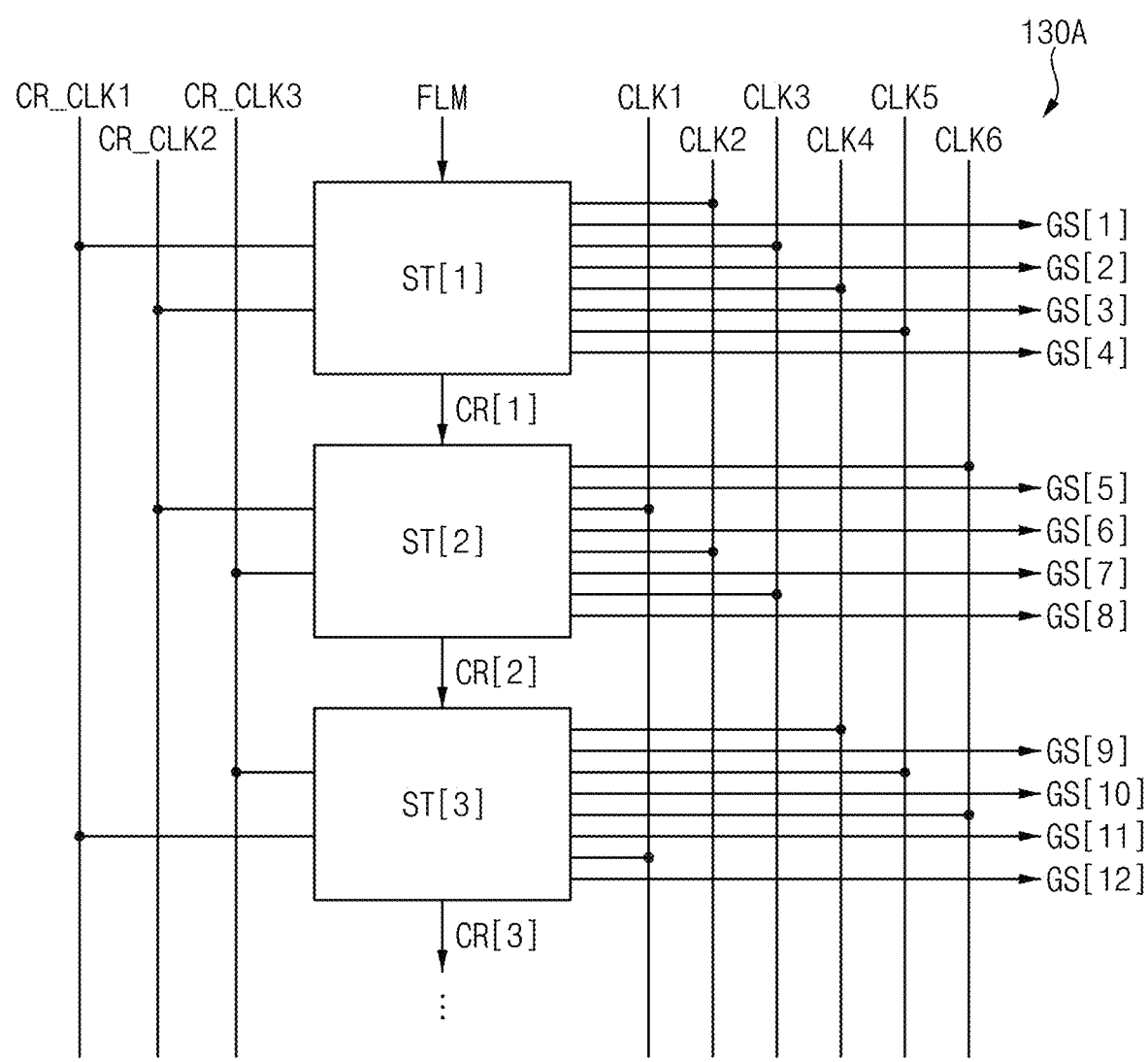
FIG. 2 is a block diagram showing one example of the gate driver included in the display device of FIG. 1.
Figure 3:
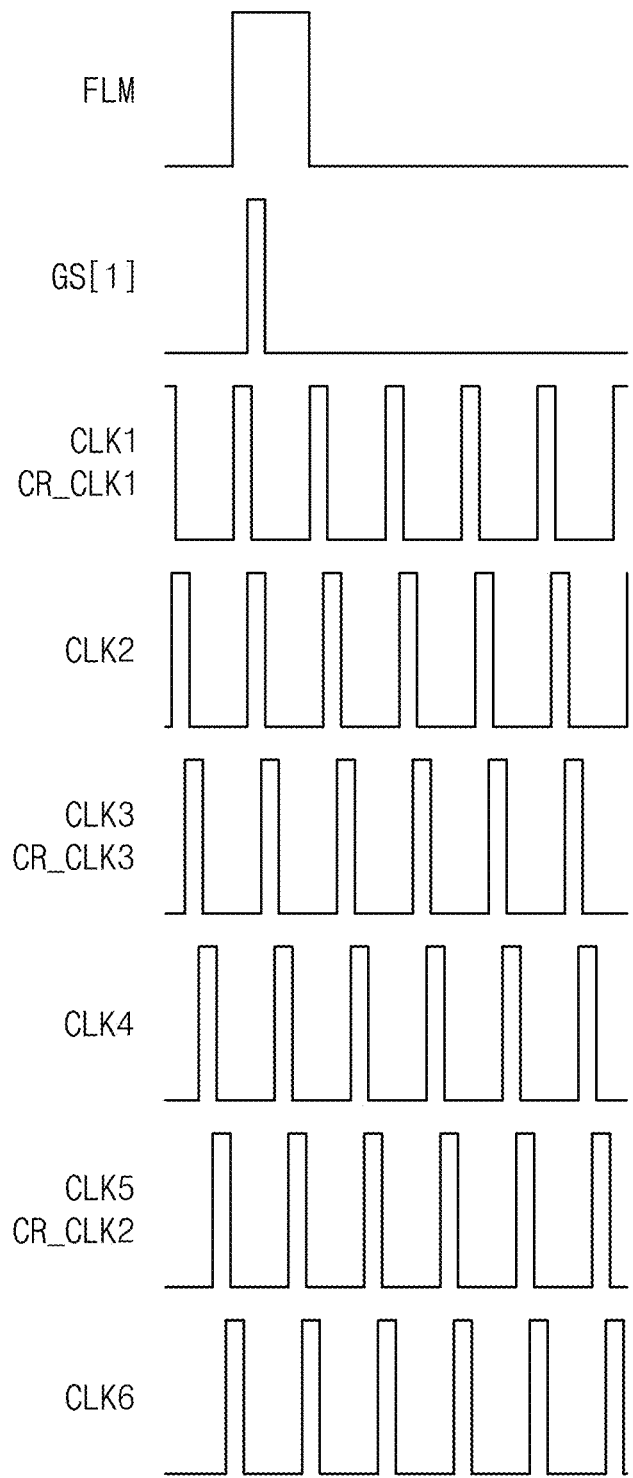
FIG. 3 is a timing diagram showing first to third carry clock signals and first to sixth clock signals.

FIG. 2 is a block diagram showing one example 130A of the gate driver 130 included in the display device 10 of FIG. 1. FIG. 3 is a timing diagram showing first to third carry clock signals CR_CLK1, CR_CLK2 and CR_CLK3 and first to sixth clock signals CLK1, CLK2, CLK3, CLK4, CLK5 and CLK6.

Referring to FIGS. 1 to 3, the gate driver 130A may include a plurality of stages ST[1], ST[2], ST[3], . . . .

The stages ST[1], ST[2], ST[3], . . . may receive a gate start signal FLM, first to third carry clock signals CR_CLK1, CR_CLK2 and CR_CLK3, and first to sixth clock signals CLK1, CLK2, CLK3, CLK4, CLK5 and CLK6. The stages ST[1], ST[2], ST[3], . . . may sequentially output a plurality of carry signals CR[1], CR[2], CR[3], . . . , respectively, and a plurality of gate signals GS[1], GS[2], GS[3], GS[4], GS[5], GS[6], GS[7], GS[8], GS[9], GS[10], GS[11], GS[12], . . . in response to the gate start signal FLM, the first to third carry clock signals CR_CLK1, CR_CLK2 and CR_CLK3, and the first to sixth clock signals CLK1, CLK2, CLK3, CLK4, CLK5 and CLK6.

A first stage ST[1] may receive the gate start signal FLM as an input signal, and the subsequent stages ST[2], ST[3], . . . may receive a carry signal from a previous stage as the input signal.

The carry signals CR[1], CR[2], CR[3], . . . may have timings different from each other, and each of the gate signals GS[1], GS[2], GS[3], GS[4], GS[5], GS[6], GS[7], GS[8], GS[9], GS[10], GS[11] and GS[12] may have timings different from each other.

The first stage ST[1] may receive the gate start signal FLM based on the first carry clock signal CR_CLK1, may output a first carry signal CR[1] based on the second carry clock signal CR_CLK2, and may sequentially output a plurality of gate signals GS[1], GS[2], GS[3] and GS[4] based on the second clock signal CLK2, the third clock signal CLK3, the fourth clock signal CLK4, and the fifth clock signal CLK5.

The a second stage ST[2] may receive the first carry signal CR[1] based on the second carry clock signal CR_CLK2, may output a second carry signal CR[2] based on the third carry clock signal CR_CLK3, and may sequentially output a plurality of gate signals GS[5], GS[6], GS[7] and GS[8] based on the sixth clock signal CLK6, the first clock signal CLK1, the second clock signal CLK2, and the third clock signal CLK3.

The third stage ST[3] may receive the second carry signal CR[2] based on the third carry clock signal CR_CLK3, may output a third carry signal CR[3] based on the first carry clock signal CR_CLK1, and may sequentially output a plurality of gate signals GS[9], GS[10], GS[11] and GS[12] based on the fourth clock signal CLK4, the fifth clock signal CLK5, the sixth clock signal CLK6, and the first clock signal CLK1.

The timing of the first carry clock signal CR_CLK1 may be the same as the timing of the first clock signal CLK1, the timing of the second carry clock signal CR_CLK2 may be the same as the timing of the fifth clock signal CLK5, and the timing of the third carry clock signal CR_CLK3 may be the same as the timing of the third clock signal CLK3.

Figure 4:
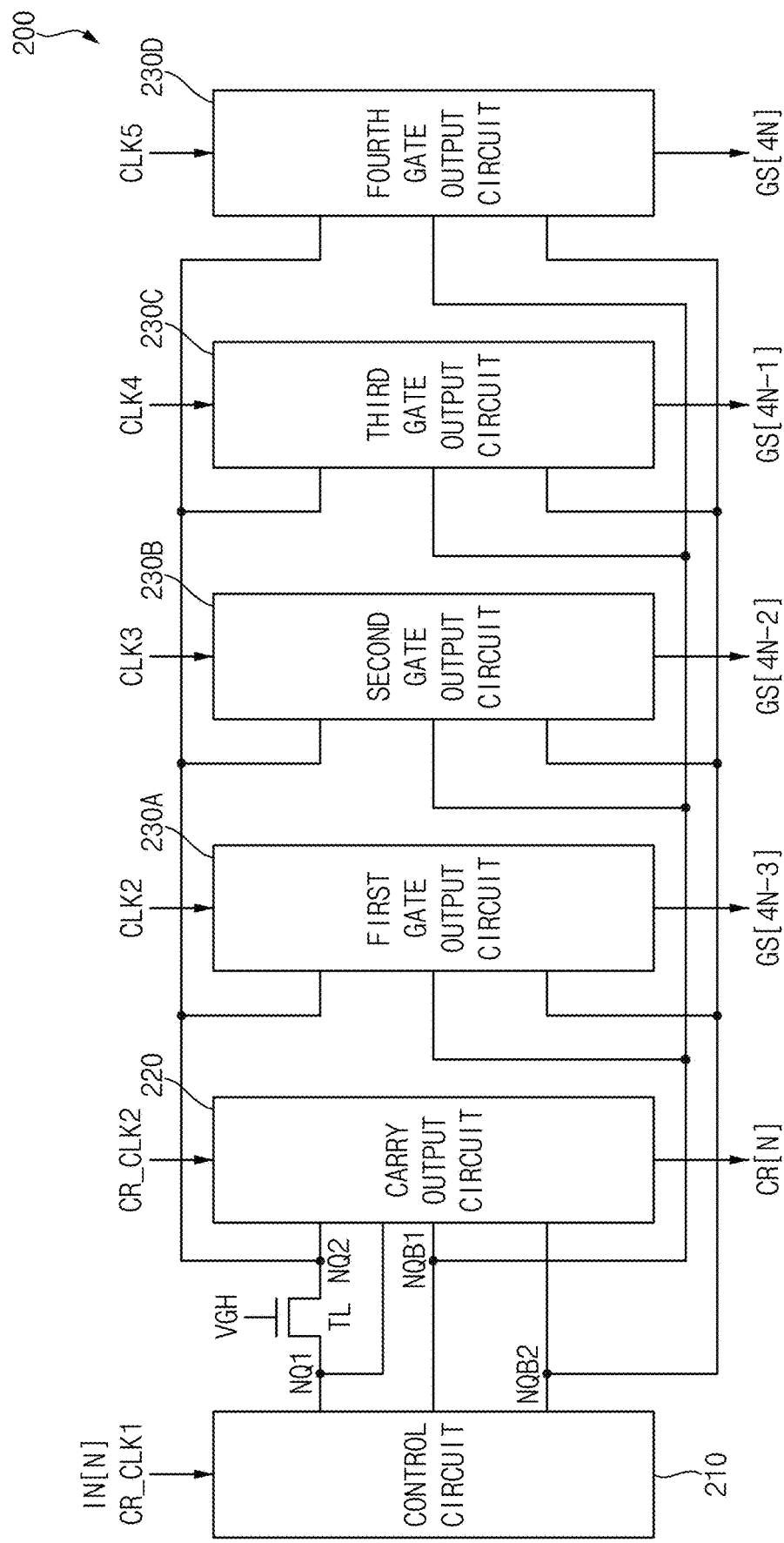
FIG. 4 is a block diagram showing a stage of the gate driver of FIG. 2.

FIG. 4 is a block diagram showing a stage 200 of the gate driver 130A of FIG. 2.

Referring to FIGS. 1 to 4, each stage 200 of the gate driver 130A according to an embodiment of the present disclosure may include a control circuit 210, a node separation transistor TL, a carry output circuit 220, and gate output circuits 230A, 230B, 230C, and 230D.

The control circuit 210 may receive an input signal IN[N] and a first carry clock signal CR_CLK1. The control circuit 210 may control a first control node NQ1, a first inversion control node NQB1, and a second inversion control node NQB2 based on the input signal IN[N] and the first carry clock signal CR_CLK1. The input signal IN[N] may be a gate start signal FLM or a carry signal of a previous stage.

The node separation transistor TL may be connected between the first control node NQ1 and a second control node NQ2. The node separation transistor TL may separate the first control node NQ1 and the second control node NQ2 to control a voltage of the first control node NQ1. The node separation transistor TL may include a gate electrode configured to receive a high gate voltage VGH, a first electrode connected to the first control node NQ1, and a second electrode connected to the second control node NQ2. The node separation transistor TL may be referred to as an Always-On Transistor (AOT).

The carry output circuit 220 may receive a second carry clock signal CR_CLK2. The carry output circuit 220 may output a carry signal CR[N] based on a voltage of the second control node NQ2, a voltage of the first inversion control node NQB1, and a voltage of the second inversion control node NQB2. For example, the carry output circuit 220 may output the second carry clock signal CR_CLK2 as the carry signal CR[N] according to the voltage of the second control node NQ2.

The gate output circuits 230A, 230B, 230C and 230D may output a plurality of gate signals GS[4N-3], GS[4N-2], GS[4N-1] and GS[4N] based on the voltage of the second control node NQ2, the voltage of the first inversion control node NQB1, and the voltage of the second inversion control node NQB2. Each of the gate signals GS[4N-3], GS[4N-2], GS[4N-1] and GS[4N] may have timings different from each other. The gate output circuits 230A, 230B, 230C and 230D may include a first gate output circuit 230A, a second gate output circuit 230B, a third gate output circuit 230C, and a fourth gate output circuit 230D. The first gate output circuit 230A may output the second clock signal CLK2 as the first gate signal GS[4N-3] in response to the voltage of the second control node NQ2. The second gate output circuit 230B may output the third clock signal CLK3 as the second gate signal GS[4N-2] in response to the voltage of the second control node NQ2. The third gate output circuit 230C may output the fourth clock signal CLK4 as the third gate signal GS[4N-1] in response to the voltage of the second control node NQ2. The fourth gate output circuit 230D may output the fifth clock signal CLK5 as the fourth gate signal GS[4N] in response to the voltage of the second control node NQ2.

Figure 5:
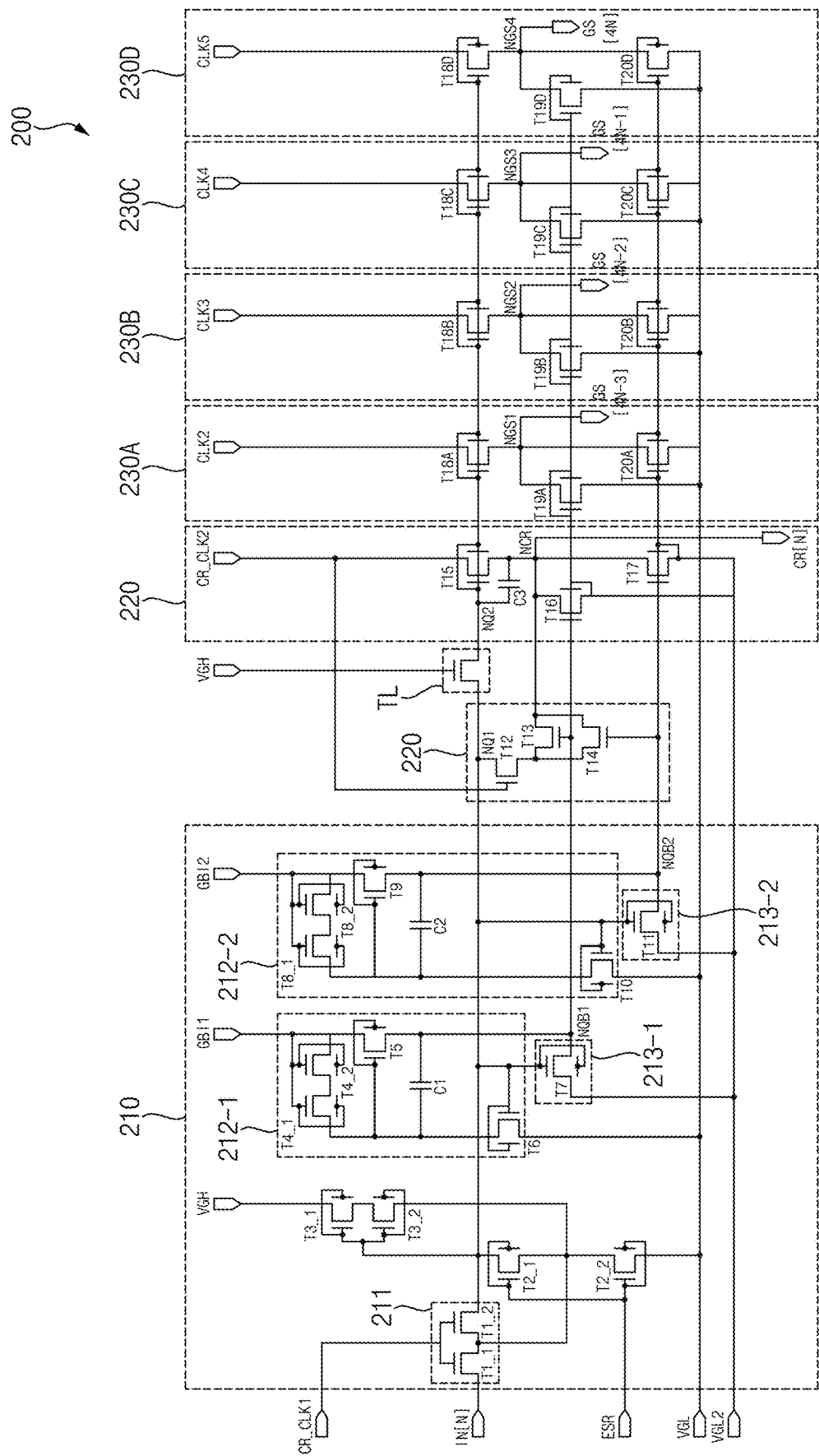
FIG. 5 is a circuit diagram showing a stage of the gate driver of FIG. 2.
Figure 6:
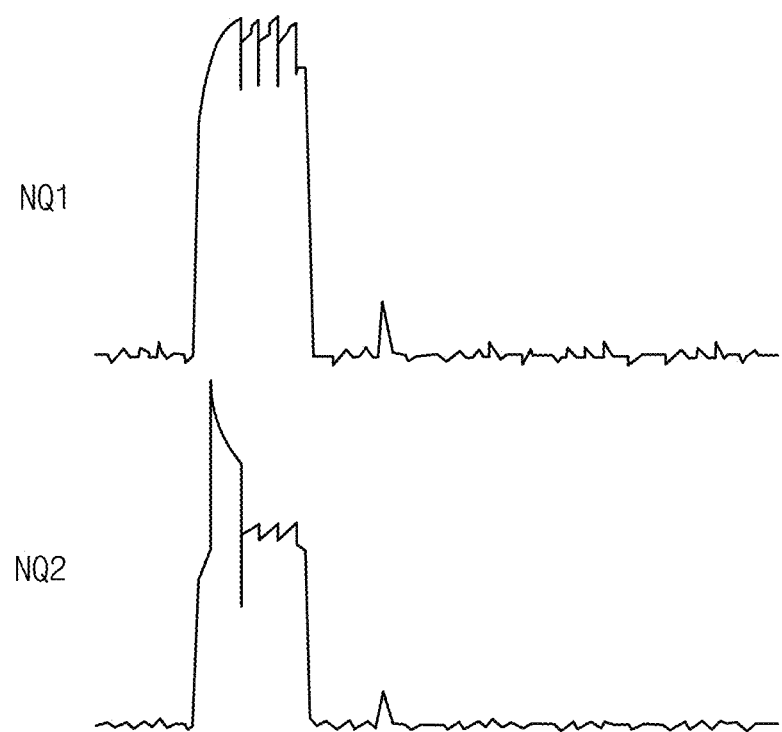
FIG. 6 is a timing diagram showing a voltage of the first control node and a voltage of the second control node.

FIG. 5 is a circuit diagram showing a stage 200 of the gate driver 130A of FIG. 2. FIG. 6 is a timing diagram showing a voltage of the first control node NQ1 and a voltage of the second control node NQ2.

Referring to FIGS. 1 to 6, each stage 200 of the gate driver 130A according to an embodiment of the present disclosure may include a control circuit 210, a node separation transistor TL, a carry output circuit 220, and gate output circuits 230A, 230B, 230C, and 230D.

The control circuit 210 may control the first control node NQ1 in response to the first carry clock signal CR_CLK1. The control circuit 210 may include an input circuit 211, a first selection circuit 212-1, and a first inversion control circuit 213-1.

The input circuit 211 may provide an input signal IN[N] to the first control node NQ1 in response to the first carry clock signal CR_CLK1. The input circuit 211 may include first transistors T1_1 and T1_2.

The first transistors T1_1 and T1_2 may include a gate electrode configured to receive the first carry clock signal CR_CLK1, a first electrode configured to receive the input signal IN[N], and a second electrode connected to the first control node NQ1. The first transistors T1_1 and T1_2 may provide the input signal IN[N] to the first control node NQ1 in response to the first carry clock signal CR_CLK1. In an embodiment, the first transistors T1_1 and T1-2 may include a first-1 transistor T1_1 and a first-2 transistor T1_2 which are connected in series and have gate electrodes connected to each other.

The first selection circuit 212-1 may provide the first selection signal GBI1 to a first inversion control node NQB1 in response to a first selection signal GBI1. The voltage of the first inversion control node NQ1 may be controlled by the first selection circuit 212-1. The first selection circuit GBI1 may include fourth transistors T4_1 and T4_2, a fifth transistor T5, a sixth transistor T6, and a first capacitor C1.

The fourth transistors T4_1 and T4_2 may include a gate electrode configured to receive the first selection signal GBI1, a first electrode configured to receive the first selection signal GBI1, and a second electrode. The fourth transistors T4_1 and T4_2 may provide the first selection signal GBI1 to the second electrode of the fourth transistors T4_1 and T4_2 in response to the first selection signal GBI1. In an embodiment, the fourth transistors T4_1 and T4_2 may further include a back gate electrode connected to the gate electrode of the fourth transistors T4_1 and T4_2. In an embodiment, the fourth transistors T4_1 and T4_2 may include a fourth-1 transistor T4_1 and a fourth-2 transistor T4_2 which are connected in series and have gate electrodes connected to each other.

The fifth transistor T5 may include a gate electrode connected to the second electrode of the fourth transistors T4_1 and T4_2, a first electrode configured to receive the first selection signal GBI1, and a second electrode connected to the first inversion control node NQB1. The fifth transistor T5 may provide the first selection signal GBI1 to the first inversion control node NQB1 in response to the first selection signal GBI1 provided by the fourth transistors T4_1 and T4_2. In an embodiment, the fifth transistor T5 may further include a back gate electrode connected to the gate electrode of the fifth transistor T5.

The sixth transistor T6 may include a gate electrode connected to the first control node NQ1, a first electrode configured to receive a first low gate voltage VGL, and a second electrode connected to the gate electrode of the fifth transistor T5. The sixth transistor T6 may provide the first low gate voltage VGL to the gate electrode of the fifth transistor T5 in response to a voltage of the first control node NQ1. In an embodiment, the sixth transistor T6 may further include a back gate electrode connected to the gate electrode of the sixth transistor T6.

The first capacitor C1 may include a first electrode connected to the gate electrode of the fifth transistor T5 and a second electrode connected to the first inversion control node NQB1. The first capacitor C1 may quickly turn on and turn off the fifth transistor T5.

The first inversion control circuit 213-1 may control a voltage of the first inversion control node NQB1 based on the voltage of the first control node NQ1. The first inversion control circuit 213-1 may include a seventh transistor T7.

The seventh transistor T7 may include a gate electrode connected to the first control node NQ1, a first electrode configured to receive a second low gate voltage VGL2, and a second electrode connected to the first inversion control node NQB1. The seventh transistor T7 may provide the second low gate voltage VGL2 to the first inversion control node NQB1 in response to the voltage of the first control node NQ1. In an embodiment, the seventh transistor T7 may further include a back gate electrode connected to the gate electrode of the seventh transistor T7.

The control circuit 210 may further include a second selection circuit 212-2 and a second inversion control circuit 213-2.

The second selection circuit 212-2 may provide the second selection signal GBI2 to a second inversion control node NQB2 in response to a second selection signal GBI2. The voltage of the second inversion control node NQB2 may be controlled by the second selection circuit 212-2. The second selection circuit 212-2 may include eighth transistors T8_1 and T8_2, a ninth transistor T9, a tenth transistor T10, and a second capacitor C2.

The eighth transistors T8_1 and T8_2 may include a gate electrode configured to receive the second selection signal GBI2, a first electrode configured to receive the second selection signal GBI2, and a second electrode. The eighth transistors T8_1 and T8_2 may provide the second selection signal GBI2 to the second electrode of the eighth transistors T8_1 and T8_2 in response to the second selection signal GBI1. In an embodiment, the eighth transistors T8_1 and T8_2 may further include a back gate electrode connected to the gate electrode of the eighth transistors T8_1 and T8_2. In an embodiment, the eighth transistors T8_1 and T8_2 may include an eighth-1 transistor T8_1 and an eighth-2 transistor T8_2 which are connected in series and have gate electrodes connected to each other.

The ninth transistor T9 may include a gate electrode connected to the second electrode of the eighth transistors T8_1 and T8_2, a first electrode configured to receive the second selection signal GBI2, and a second electrode connected to the second inversion control node NQB2. The ninth transistor T9 may provide the second selection signal GBI2 to the second inversion control node NQB2 in response to the second selection signal GBI2 provided by the eighth transistors T8_1 and T8_2. In an embodiment, the ninth transistor T9 may further include a back gate electrode connected to the gate electrode of the ninth transistor T9.

The tenth transistor T10 may include a gate electrode connected to the first control node NQ1, a first electrode configured to receive the first low gate voltage VGL, and a second electrode connected to the gate electrode of the ninth transistor T9. The tenth transistor T10 may provide the first low gate voltage VGL to the gate electrode of the ninth transistor T9 in response to the voltage of the first control node NQ1. In an embodiment, the tenth transistor T10 may further include a back gate electrode connected to the gate electrode of the tenth transistor T10.

The second capacitor C2 may include a first electrode connected to the gate electrode of the ninth transistor T9 and a second electrode connected to the second inversion control node NQB2. The second capacitor C2 may quickly turn on and turn off the ninth transistor T9.

The second inversion control circuit 213-2 may control a voltage of the second inversion control node NQB2 based on the voltage of the first control node NQ1. The second inversion control circuit 213-2 may include an 11th transistor T11.

The 11th transistor T11 may include a gate electrode connected to the first control node NQ1, a first electrode configured to receive the second low gate voltage VGL2, and a second electrode connected to the second inversion control node NQB2. The 11th transistor T11 may provide the second low gate voltage VGL2 to the second inversion control node NQB2 in response to the voltage of the first control node NQ1. In an embodiment, the 11th transistor T11 may further include a back gate electrode connected to the gate electrode of the 11th transistor T11.

The control circuit 210 may further include second transistors T2_1 and T2_2 and third transistors T3_1 and T3_2.

The second transistors T2_1 and T2_2 may include a gate electrode configured to receive a reset signal ESR, a first electrode configured to receive the first low gate voltage VGL, and a second electrode connected to the first control node NQ1. The second transistors T2_1 and T2_2 may provide the first low gate voltage VGL to the first control node NQ1 in response to the reset signal ESR. The first control node NQ1 may be reset to the first low gate voltage VGL. In an embodiment, the second transistors T2_1 and T2_2 may further include a back gate electrode connected to the gate electrode of the second transistors T2_1 and T2_2. In an embodiment, the second transistors T2_1 and T2_2 may include a second-1 transistor T2_1 and a second-2 transistor T2_2 which are connected in series and have gate electrodes connected to each other.

The third transistors T3_1 and T3_2 may include a gate electrode connected to the first control node NQ1, a first electrode configured to receive a high gate voltage VGH, and a second electrode. The second electrode of the third transistors T3_1 and T3_2 may be connected to an intermediate node of the first transistors T1_1 and T1_2 and an intermediate node of the second transistors T2_1 and T2_2. The third transistors T3_1 and T3_2 may provide the high gate voltage VGH to the intermediate node of the first transistors T1_1 and T1_2 and the intermediate node of the second transistors T2_1 and T2_2 in response to the voltage of the first control node NQ1. Thus, the third transistors T3_1 and T3_2 may prevent the first transistors T1_1 and T1_2 and the second transistors T2_1 and T2_2 from being deteriorated. In an embodiment, the third transistors T3_1 and T3_2 may include a third-1 transistor T3_1 and a third-2 transistor T3_2 which are connected in series and have gate electrodes connected to each other.

The node separation transistor TL may be connected between the first control node NQ1 and a second control node NQ2. The node separation transistor TL may separate the first control node NQ1 and the second control node NQ2 to control the voltage of the first control node NQ1. The node separation transistor TL may include a gate electrode configured to receive the high gate voltage VGH, a first electrode connected to the first control node NQ1, and a second electrode connected to the second control node NQ2. The node separation transistor TL may be an Always-On Transistor (AOT). Since the second carry clock signal CR_CLK2, the second clock signal CLK2, the third clock signal CLK3, the fourth clock signal CLK4, and the fifth clock signal CLK5 periodically toggle, the voltage of the second control node NQ2 may fluctuate as shown in FIG. 6. When the first control node NQ1 and the second control node NQ2 are separated from each other by the node separation transistor TL, the voltage of the first control node NQ1 may not fluctuate even though the voltage of the second control node NQ2 fluctuates.

The carry output circuit 220 may receive the second carry clock signal CR_CLK2. The carry output circuit 220 may include a 15th transistor T15, a 16th transistor T16, a 12th transistor T12, a 13th transistor T13, and a third capacitor C3.

The 15th transistor T15 may include a gate electrode connected to the second control node NQ2, a first electrode configured to receive the second carry clock signal CR_CLK2, and a second electrode connected to a carry output node NCR. The carry signal CR[N] may be output from the carry output node NCR. The 15th transistor T15 may provide the second carry clock signal CR_CLK2 to the carry output node NCR in response to the voltage of the second control node NQ2. In an embodiment, the 15th transistor T15 may further include a back gate electrode connected to the gate electrode of the 15th transistor T15.

The 16th transistor T16 may include a gate electrode connected to the first inversion control node NQB1, a first electrode configured to receive the second low gate voltage VGL2, and a second electrode connected to the carry output node NCR. The 16th transistor T16 may provide the second low gate voltage VGL2 to the carry output node NCR in response to the voltage of the first inversion control node NQB1. In an embodiment, the 16th transistor T16 may further include a back gate electrode connected to the first electrode of the 16th transistor T16.

The 12th transistor T12 may include a gate electrode configured to receive the second carry clock signal CR_CLK2, a first electrode connected to the first control node NQ1, and a second electrode. The 12th transistor T12 may provide the voltage of the first control node NQ1 to the second electrode of the 12th transistor T12 in response to the second carry clock signal CR_CLK2.

The 13th transistor T13 may include a gate electrode connected to the first inversion control node NQB1, a first electrode connected to the second electrode of the 12th transistor T12, and a second electrode connected to the carry output node NCR. The 13th transistor T13 may provide the voltage of the first control node NQ1 provided by the 12th transistor T12 to the carry output node NCR in response to the voltage of the first inversion control node NQB1.

The third capacitor C3 may include a first electrode connected to the second control node NQ2 and a second electrode connected to the carry output node NCR. The third capacitor C3 may reduce a distorted waveform of the carry signal CR[N].

The carry output circuit 220 may further include a 17th transistor T17 and a 14th transistor T14.

The 17th transistor T17 may include a gate electrode connected to the second inversion control node NQB2, a first electrode configured to receive the second low gate voltage VGL2, and a second electrode connected to the carry output node NCR. The 17th transistor T17 may provide the second low gate voltage VGL2 to the carry output node NCR in response to the voltage of the second inversion control node NQB2. In an embodiment, the 17th transistor T17 may include a back gate electrode connected to the first electrode of the 17th transistor T17.

The 14th transistor T14 may include a gate electrode connected to the second inversion control node NQB2, a first electrode connected to the second electrode of the 12th transistor T12, and a second electrode connected to the carry output node NCR. The 14th transistor T14 may provide the voltage of the first control node NQ1 provided by the 12th transistor T12 to the carry output node NCR in response to the voltage of the second inversion control node NQB2.

The gate output circuits 230A, 230B, 230C and 230D may include a first gate output circuit 230A and a second gate output circuit 230B.

The first gate output circuit 230A may receive the second clock signal CLK2. The first gate output circuit 230A may include an 18Ath transistor T18A and a 19Ath transistor T19A.

The 18Ath transistor T18A may include a gate electrode connected to the second control node NQ2, a first electrode configured to receive the second clock signal CLK2, and a second electrode connected to a first gate output node NGS1. The first gate signal GS[4N-3] may be output from the first gate output node NGS1. The 18Ath transistor T18A may provide the second clock signal CLK2 to the first gate output node NGS1 in response to the voltage of the second control node NQ2. In an embodiment, the 18Ath transistor T18A may further include a back gate electrode connected to the gate electrode of the 18Ath transistor T18A.

The 19Ath transistor T19A may include a gate electrode connected to the first inversion control node NQB1, a first electrode configured to receive the first low gate voltage VGL, and a second electrode connected to the first gate output node NGS1. The 19Ath transistor T19A may provide the first low gate voltage VGL to the first gate output node NGS1 in response to the voltage of the first inversion control node NQB1.

The first gate output circuit 230A may further include a 20Ath transistor T20A.

The 20Ath transistor T20A may include a gate electrode connected to the second inversion control node NQB2, a first electrode configured to receive the first low gate voltage VGL, and a second electrode connected to the first gate output node NGS1. The 20Ath transistor T20A may provide the first low gate voltage VGL to the first gate output node NGS1 in response to the voltage of the second inversion control node NQB2.

The second gate output circuit 230B may receive the third clock signal CLK3. The second gate output circuit 230B may include an 18Bth transistor T18B and a 19Bth transistor T19B.

The 18Bth transistor T18B may include a gate electrode connected to the second control node NQ2, a first electrode configured to receive the third clock signal CLK3, and a second electrode connected to a second gate output node NGS2. The second gate signal GS[4N-2] may be output from the second gate output node NGS2. The 18Bth transistor T18B may provide the third clock signal CLK3 to the second gate output node NGS2 in response to the voltage of the second control node NQ2. In an embodiment, the 18Bth transistor T18B may further include a back gate electrode connected to the gate electrode of the 18Bth transistor T18B.

The 19Bth transistor T19B may include a gate electrode connected to the first inversion control node NQB1, a first electrode configured to receive the first low gate voltage VGL, and a second electrode connected to the second gate output node NGS2. The 19Bth transistor T19B may provide the first low gate voltage VGL to the second gate output node NGS2 in response to the voltage of the first inversion control node NQB1.

The second gate output circuit 230B may further include a 20Bth transistor T20B.

The 20Bth transistor T20B may include a gate electrode connected to the second inversion control node NQB2, a first electrode configured to receive the first low gate voltage VGL, and a second electrode connected to the second gate output node NGS2. The 20Bth transistor T20B may provide the first low gate voltage VGL to the second gate output node NGS2 in response to the voltage of the second inversion control node NQB2.

The gate output circuits 230A, 230B, 230C and 230D may further include a third gate output circuit 230C and a fourth gate output circuit 230D.

The third gate output circuit 230C may receive the fourth clock signal CLK4. The third gate output circuit 230C may include an 18Cth transistor T18C and a 19Cth transistor T19C.

The 18Cth transistor T18C may include a gate electrode connected to the second control node NQ2, a first electrode configured to receive the fourth clock signal CLK4, and a second electrode connected to a third gate output node NGS3. The third gate signal GS[4N-1] may be output from the third gate output node NGS3. The 18Cth transistor T18C may provide the fourth clock signal CLK4 to the third gate output node NGS3 in response to the voltage of the second control node NQ2. In an embodiment, the 18Cth transistor T18C may further include a back gate electrode connected to the gate electrode of the 18Cth transistor T18C.

The 19Cth transistor T19C may include a gate electrode connected to the first inversion control node NQB1, a first electrode configured to receive the first low gate voltage VGL, and a second electrode connected to the third gate output node NGS3. The 19Cth transistor T19C may provide the first low gate voltage VGL to the third gate output node NGS3 in response to the voltage of the first inversion control node NQB1.

The third gate output circuit 230C may further include a 20Cth transistor T20C.

The 20Cth transistor T20C may include a gate electrode connected to the second inversion control node NQB2, a first electrode configured to receive the first low gate voltage VGL, and a second electrode connected to the third gate output node NGS3. The 20Cth transistor T20C may provide the first low gate voltage VGL to the third gate output node NGS3 in response to the voltage of the second inversion control node NQB2.

The fourth gate output circuit 230D may receive the fifth clock signal CLK5. The fourth gate output circuit 230D may include an 18Dth transistor T18D and a 19Dth transistor T19D.

The 18Dth transistor T18D may include a gate electrode connected to the second control node NQ2, a first electrode configured to receive the fifth clock signal CLK5, and a second electrode connected to a fourth gate output node NGS4. The fourth gate signal GS[4N] may be output from the fourth gate output node NGS4. The 18Dth transistor T18D may provide the fifth clock signal CLK5 to the fourth gate output node NGS4 in response to the voltage of the second control node NQ2. In an embodiment, the 18Dth transistor T18D may further include a back gate electrode connected to the gate electrode of the 18Dth transistor T18D.

The 19Dth transistor T19D may include a gate electrode connected to the first inversion control node NQB1, a first electrode configured to receive the first low gate voltage VGL, and a second electrode connected to the fourth gate output node NGS4. The 19Dth transistor T19D may provide the first low gate voltage VGL to the fourth gate output node NGS4 in response to the voltage of the first inversion control node NQB1.

The fourth gate output circuit 230D may further include a 20Dth transistor T20D.

The 20Dth transistor T20D may include a gate electrode connected to the second inversion control node NQB2, a first electrode configured to receive the first low gate voltage VGL, and a second electrode connected to the fourth gate output node NGS4. The 20Dth transistor T20D may provide the first low gate voltage VGL to the fourth gate output node NGS4 in response to the voltage of the second inversion control node NQB2.

In an embodiment, all of the transistors T1_1, T1_2, T2_1, T2_2, T3_1, T3_2, T4_1, T4_2, T5, T6, T7, T8_1, T8_2, T9, T10, T11, T12, T13, T14, T15, T16, T17, T18A, T18B, T18C, T18D, T19A, T19B, T19C, T19D, T20A, T20B, T20C, T20D, and TL included in each of the stage 200 may be N-type transistors (e.g., NMOS transistors) or oxide transistors.

As described above, since the gate output circuits 230A, 230B, 230C and 230D share the control circuit 210, the node separation transistor TL, and the carry output circuit 220, the number of transistors and the number of signal lines in each of the stage 200 may decrease, and a dead space and power consumption of the display device 10 may decrease. In addition, each of the stage 200 includes the node separation transistor TL which separates the first control node NQ1 and the second control node NQ2, and thus reliability of the display device 10 may be improved.

Figure 7:
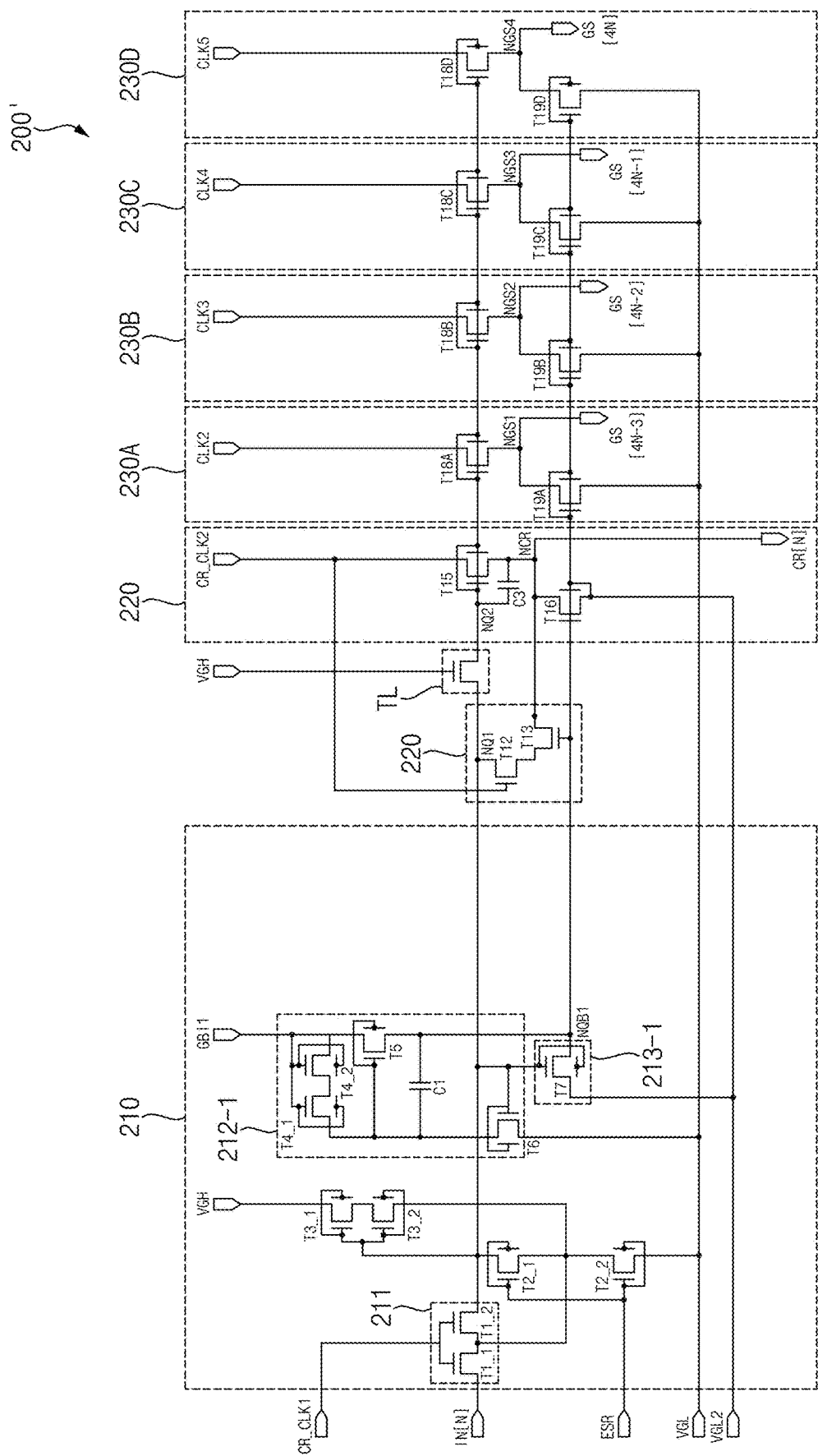
FIG. 7 is a circuit diagram showing a stage of the gate driver of FIG. 2.

FIG. 7 is a circuit diagram showing a stage 200' of the gate driver 130A of FIG. 2.

Each stage 200' in FIG. 7 is the same as each stage 200 in FIG. 5 except for not including a second selection circuit 212-2, a second inversion control circuit 213-2, a 14th transistor T14 and a seventh transistor T17 of a carry output circuit 220, a 20Ath transistor T20A of a first gate output circuit 230A, a 20Bth transistor T20B of a second gate output circuit 230B, a 20Cth transistor T20C of a third gate output circuit 230C, and a 20Dth transistor T20D of a fourth gate output circuit 230D, and thus the same reference numerals are used for the same or similar components, and redundant descriptions are omitted.

Referring to FIGS. 1 to 7, since the gate output circuits 230A, 230B, 230C and 230D share a control circuit 210, a node separation transistor TL, and a carry output circuit 220, the number of transistors and the number of signal lines in each stage 200 may decrease, and a dead space and power consumption of the display device 10 may decrease. In addition, each of the stage 200' includes a node separation transistor TL which separates a first control node NQ1 and a second control node NQ2, and thus reliability of the display device 10 may be improved.

Figure 8:
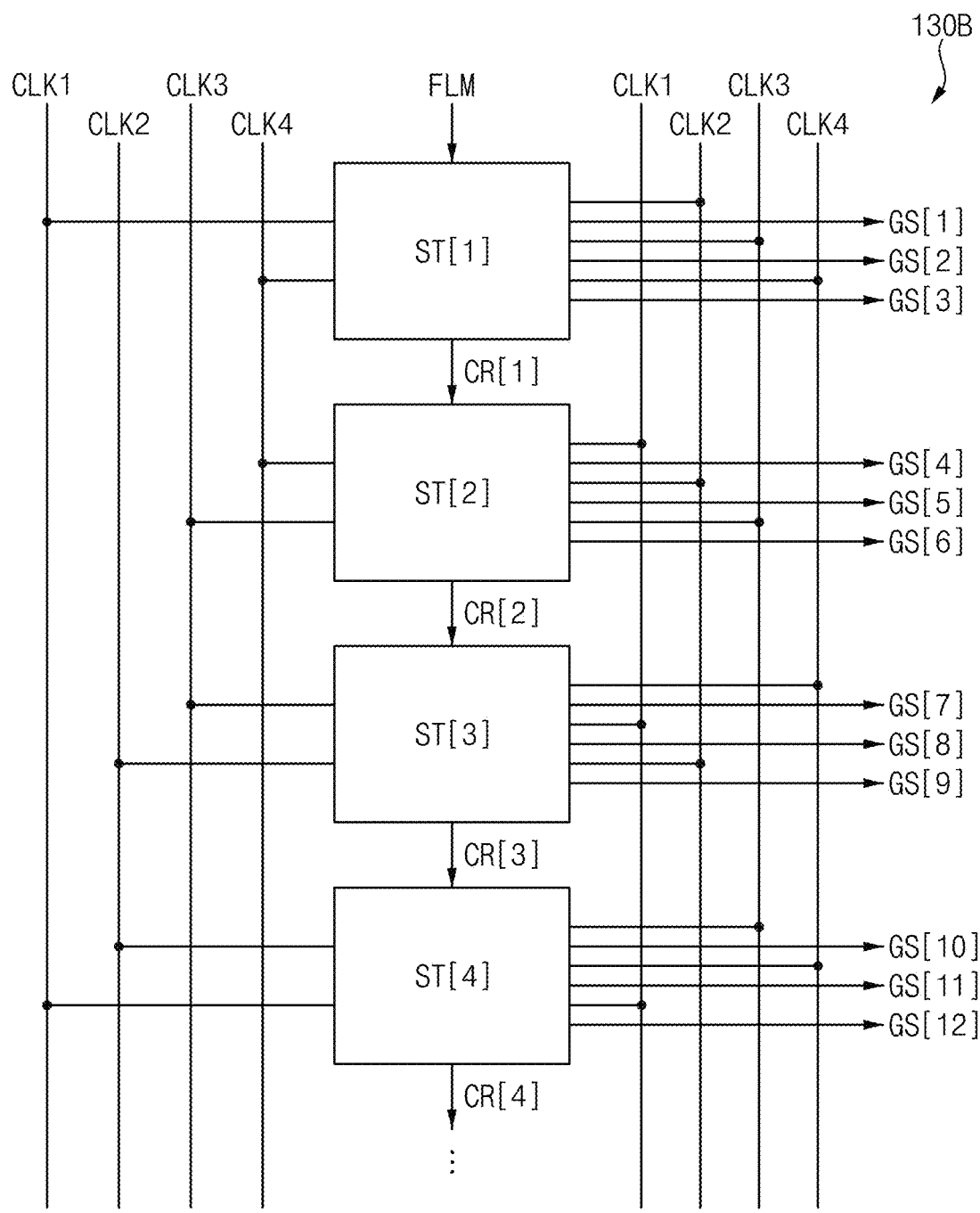
FIG. 8 is a block diagram showing an example of the gate driver included in the display device of FIG. 1.

FIG. 8 is a block diagram showing an example 130B of the gate driver 130 included in the display device 10 of FIG. 1.

Referring to FIGS. 1 and 8, the gate driver 130B may include a plurality of stages ST[1], ST[2], ST[3], ST[4], . . . .

The stages ST[1], ST[2], ST[3], ST[4], . . . may receive a gate start signal FLM and first to fourth clock signals CLK1, CLK2, CLK3, and CLK4. The stages ST[1], ST[2], ST[3], ST[4], . . . may sequentially output a plurality of carry signals CR[1], CR[2], CR[3], CR[4], . . . , respectively, and a plurality of gate signals GS[1], GS[2], GS[3], GS[4], GS[5], GS[6], GS[7], GS[8], GS[9], GS[10], GS[11], GS[12], . . . in response to the gate start signal FLM and the first to fourth clock signals CLK1, CLK2, CLK3 and CLK4.

A first stage ST[1] may receive the gate start signal FLM as an input signal, and the subsequent stages ST[2], ST[3], ST[4] . . . may receive a carry signals from a previous stage.

The carry signals CR[1], CR[2], CR[3], CR[4] . . . may have timings different from each other, and each of the gate signals GS[1], GS[2], GS[3], GS[4], GS[5], GS[6], GS[7], GS[8], GS[9], GS[10], GS[11] and GS[12] may have timings different from each other.

The first stage ST[1] may receive the gate start signal FLM based on the first clock signal CLK1, may output a first carry signal CR[1] based on the fourth clock signal CLK4, and may sequentially output a plurality of gate signals GS[1], GS[2] and GS[3] based on the second clock signal CLK2, the third clock signal CLK3, and the fourth clock signal CLK4.

The second stage ST[2] may receive the first carry signal CR[1] based on the fourth clock signal CLK4, may output a second carry signal CR[2] based on the third clock signal CLK3, and may sequentially output a plurality of gate signals GS[4], GS[5] and GS[6] based on the first clock signal CLK1, the second clock signal CLK2, and the third clock signal CLK3.

The third stage ST[3] may receive the second carry signal CR[2] based on the third clock signal CLK3, may output a third carry signal CR[3] based on the second clock signal CLK2, and may sequentially output a plurality of gate signals GS[7], GS[8] and GS[9] based on the fourth clock signal CLK4, the first clock signal CLK1, and the second clock signal CLK2.

The fourth stage ST[4] may receive the third carry signal CR[3] based on the second clock signal CLK2, may output a fourth carry signal CR[4] based on the first clock signal CLK1, and may sequentially output a plurality of gate signals GS[10], GS[11] and GS[12] based on the third clock signal CLK3, the fourth clock signal CLK4, and the first clock signal CLK1.

Figure 9:
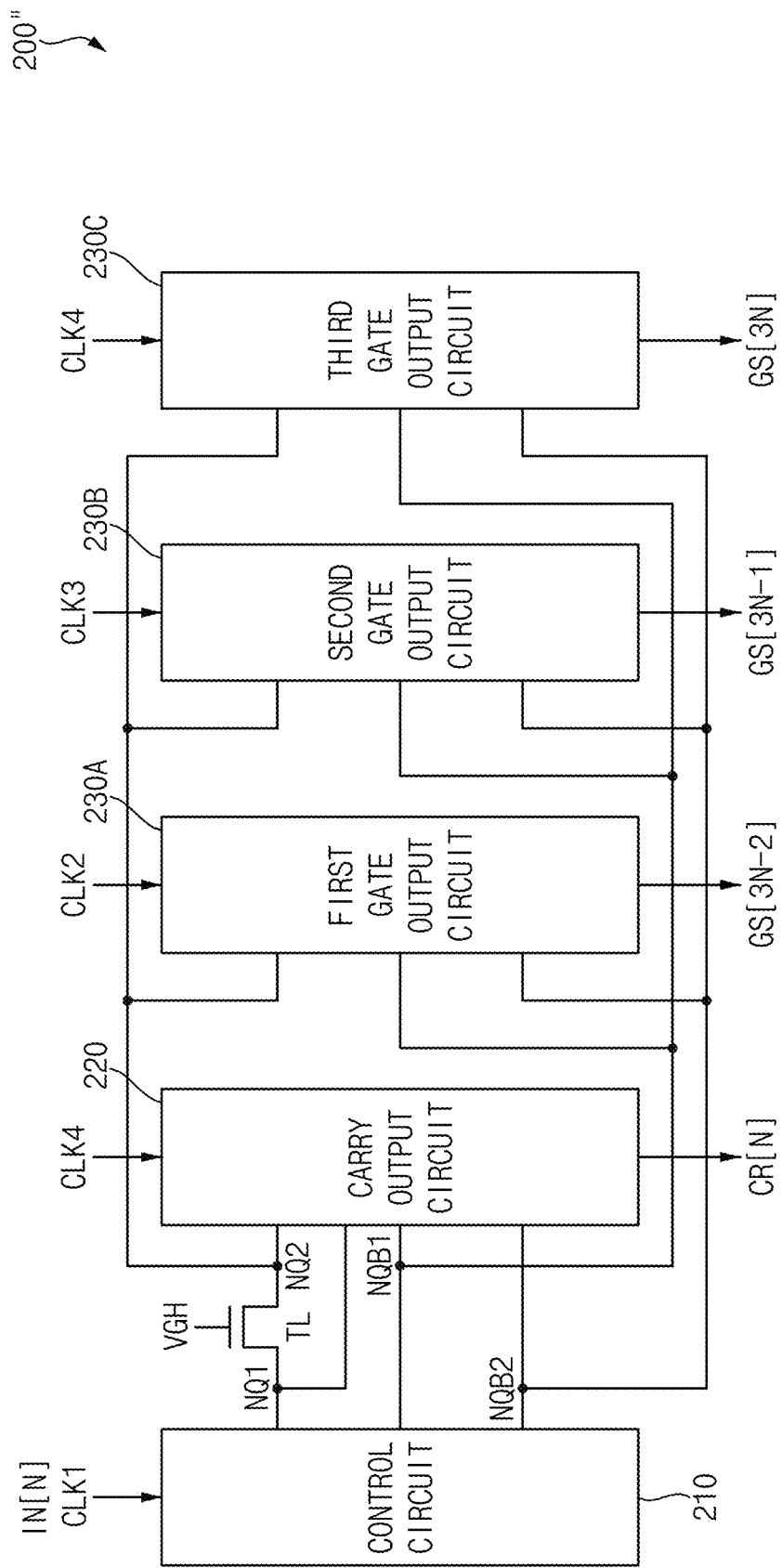
FIG. 9 is a block diagram showing a stage of the gate driver of FIG. 8.

FIG. 9 is a block diagram showing a stage 200″ of the gate driver 130B of FIG. 8.

Referring to FIGS. 1, 8 and 9, each stage 200″ of the gate driver 130B according to an embodiment of the present disclosure may include a control circuit 210, a node separation transistor TL, a carry output circuit 220, and gate output circuits 230A, 230B, and 230C.

The control circuit 210 may receive an input signal IN[N] and a first clock signal CLK1. The control circuit 210 may control a first control node NQ1, a first inversion control node NQB1, and a second inversion control node NQB2 based on the input signal IN[N] and the first clock signal CLK1. The input signal IN[N] may be a gate start signal FLM or a carry signal of a previous stage.

The node separation transistor TL may be connected between the first control node NQ1 and a second control node NQ2. The node separation transistor TL may separate the first control node NQ1 and the second control node NQ2 to control a voltage of the first control node NQ1. The node separation transistor TL may include a gate electrode configured to receive a high gate voltage VGH, a first electrode connected to the first control node NQ1, and a second electrode connected to the second control node NQ2. The node separation transistor TL may be an Always-On Transistor (AOT).

The carry output circuit 220 may receive a fourth clock signal CLK4. The carry output circuit 220 may output a carry signal CR[N] based on a voltage of the second control node NQ2, a voltage of the first inversion control node NQB1, and a voltage of the second inversion control node NQB2. For example, the carry output circuit 220 may output the fourth clock signal CLK4 as the carry signal CR[N] in response to the voltage of the second control node NQ2.

The gate output circuits 230A, 230B and 230C may output a plurality of gate signals GS[3N-2], GS[3N-1] and GS[3N], respectively, based on the voltage of the second control node NQ2, the voltage of the first inversion control node NQB1, and the voltage of the second inversion control node NQB2. Each of the gate signals GS[3N-2], GS[3N-1], and GS[3N] may have timings different from each other. The gate output circuits 230A, 230B and 230C may include a first gate output circuit 230A, a second gate output circuit 230B, and a third gate output circuit 230C. The first gate output circuit 230A may output the second clock signal CLK2 as the first gate signal GS[3N-2] in response to the voltage of the second control node NQ2. The second gate output circuit 230B may output the third clock signal CLK3 as the second gate signal GS[3N-1] in response to the voltage of the second control node NQ2. The third gate output circuit 230C may output the fourth clock signal CLK4 as the third gate signal GS[3N] in response to the voltage of the second control node NQ2.

Figure 10:
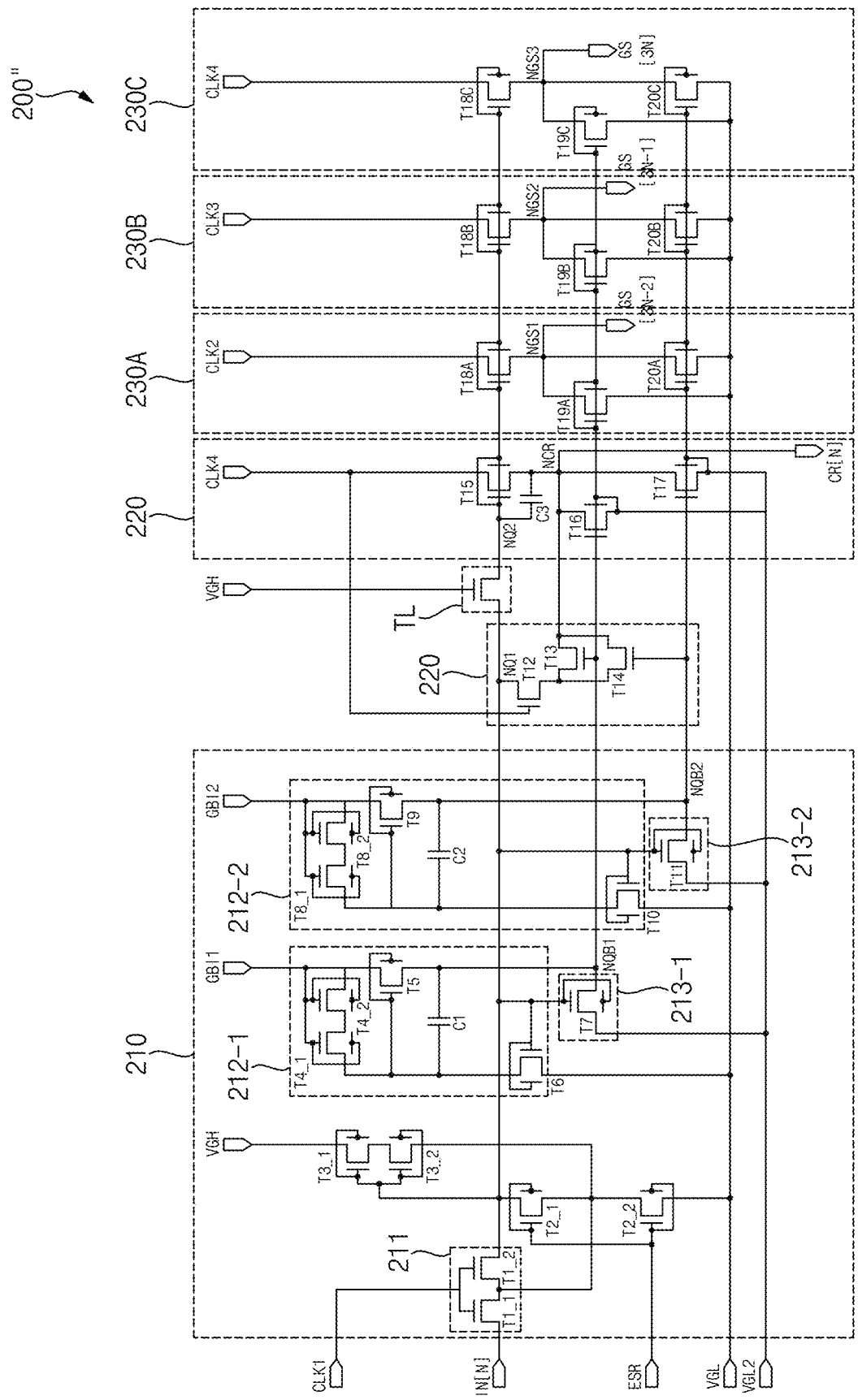
FIG. 10 is a circuit diagram showing a stage of the gate driver of FIG. 8.

FIG. 10 is a circuit diagram showing a stage 200″ of the gate driver 130B of FIG. 8.

Referring to FIGS. 1 and 8 to 10, each stage 200″ of the gate driver 130B according to an embodiment of the present disclosure may include a control circuit 210, a node separation transistor TL, a carry output circuit 220, and gate output circuits 230A, 230B, and 230C.

The control circuit 210 may control the first control node NQ1 in response to the first clock signal CLK1. The control circuit 210 may include an input circuit 211, a first selection circuit 212-1, and a first inversion control circuit 213-1.

The input circuit 211 may provide an input signal IN[N] to the first control node NQ1 in response to the first clock signal CLK1. The input circuit 211 may include first transistors T1_1 and T1_2.

The first transistors T1_1 and T1_2 may include a gate electrode configured to receive the first clock signal CLK1, a first electrode configured to receive the input signal IN[N], and a second electrode connected to the first control node NQ1. The first transistors T1_1 and T1_2 may provide the input signal IN[N] to the first control node NQ1 in response to the first clock signal CLK1. In an embodiment, the first transistors T1_1 and T1-2 may include a first-1 transistor T1_1 and a first-2 transistor T1_2 which are connected in series and have gate electrodes connected to each other.

The first selection circuit 212-1 may provide the first selection signal GBI1 to a first inversion control node NQB1 in response to a first selection signal GBI1. The voltage of the first inversion control node NQB1 may be controlled by the first selection circuit 212-1. The first selection circuit 212-1 may include fourth transistors T4_1 and T4_2, a fifth transistor T5, a sixth transistor T6, and a first capacitor C1.

The fourth transistors T4_1 and T4_2 may include a gate electrode configured to receive the first selection signal GBI1, a first electrode configured to receive the first selection signal GBI1, and a second electrode. The fourth transistors T4_1 and T4_2 may provide the first selection signal GBI1 to the second electrode of the fourth transistors T4_1 and T4_2 in response to the first selection signal GBI1. In an embodiment, the fourth transistors T4_1 and T4_2 may further include a back gate electrode connected to the gate electrode of the fourth transistors T4_1 and T4_2. In an embodiment, the fourth transistors T4_1 and T4_2 may include a fourth-1 transistor T4_1 and a fourth-2 transistor T4_2 which are connected in series and have gate electrodes connected to each other.

The fifth transistor T5 may include a gate electrode connected to the second electrode of the fourth transistors T4_1 and T4_2, a first electrode configured to receive the first selection signal GBI1, and a second electrode connected to the first inversion control node NQB1. The fifth transistor T5 may provide the first selection signal GBI1 to the first inversion control node NQB1 in response to the first selection signal GBI1 provided by the fourth transistors T4_1 and T4_2. In an embodiment, the fifth transistor T5 may further include a back gate electrode connected to the gate electrode of the fifth transistor T5.

The sixth transistor T6 may include a gate electrode connected to the first control node NQ1, a first electrode configured to receive a first low gate voltage VGL, and a second electrode connected to the gate electrode of the fifth transistor T5. The sixth transistor T6 may provide the first low gate voltage VGL to the gate electrode of the fifth transistor T5 in response to a voltage of the first control node NQ1. In an embodiment, the sixth transistor T6 may further include a back gate electrode connected to the gate electrode of the sixth transistor T6.

The first capacitor C1 may include a first electrode connected to the gate electrode of the fifth transistor T5 and a second electrode connected to the first inversion control node NQB1. The first capacitor C1 may quickly turn on and turn off the fifth transistor T5.

The first inversion control circuit 213-1 may control a voltage of the first inversion control node NQB1 based on the voltage of the first control node NQ1. The first inversion control circuit 213-1 may include a seventh transistor T7.

The seventh transistor T7 may include a gate electrode connected to the first control node NQ1, a first electrode configured to receive a second low gate voltage VGL2, and a second electrode connected to the first inversion control node NQB1. The seventh transistor T7 may provide the second low gate voltage VGL2 to the first inversion control node NQB1 in response to the voltage of the first control node NQ1. In an embodiment, the seventh transistor T7 may further include a back gate electrode connected to the gate electrode of the seventh transistor T7.

The control circuit 210 may further include a second selection circuit 212-2 and a second inversion control circuit 213-2.

The second selection circuit 212-2 may provide the second selection signal GBI2 to a second inversion control node NQB2 in response to a second selection signal GBI2. The voltage of the second inversion control node NQ2 may be controlled by the second selection circuit 212-2. The second selection circuit GBI1 may include eighth transistors T8_1 and T8_2, a ninth transistor T9, a tenth transistor T10, and a second capacitor C2.

The eighth transistors T8_1 and T8_2 may include a gate electrode configured to receive the second selection signal GBI2, a first electrode configured to receive the second selection signal GBI2, and a second electrode. The eighth transistors T8_1 and T8_2 may provide the second selection signal GBI2 to the second electrode of the eighth transistors T8_1 and T8_2 in response to the second selection signal GBI1. In an embodiment, the eighth transistors T8_1 and T8_2 may further include a back gate electrode connected to the gate electrode of the eighth transistors T8_1 and T8_2.

In an embodiment, the eighth transistors T8_1 and T8_2 may include an eighth-1 transistor T8_1 and an eighth-2 transistor T8_2 which are connected in series and have gate electrodes connected to each other.

The ninth transistor T9 may include a gate electrode connected to the second electrode of the eighth transistors T8_1 and T8_2, a first electrode configured to receive the second selection signal GBI2, and a second electrode connected to the second inversion control node NQB2. The ninth transistor T9 may provide the second selection signal GBI2 to the second inversion control node NQB2 in response to the second selection signal GBI2 provided by the eighth transistors T8_1 and T8_2. In an embodiment, the ninth transistor T9 may further include a back gate electrode connected to the gate electrode of the ninth transistor T9.

The tenth transistor T10 may include a gate electrode connected to the first control node NQ1, a first electrode configured to receive the first low gate voltage VGL, and a second electrode connected to the gate electrode of the ninth transistor T9. The tenth transistor T10 may provide the first low gate voltage VGL to the gate electrode of the ninth transistor T9 in response to the voltage of the first control node NQ1. In an embodiment, the tenth transistor T10 may further include a back gate electrode connected to the gate electrode of the tenth transistor T10.

The second capacitor C2 may include a first electrode connected to the gate electrode of the ninth transistor T9 and a second electrode connected to the second inversion control node NQB2. The second capacitor C2 may quickly turn on and turn off the ninth transistor T9.

The second inversion control circuit 213-2 may control a voltage of the second inversion control node NQB2 based on the voltage of the first control node NQ1. The second inversion control circuit 213-2 may include an 11th transistor T11.

The 11th transistor T11 may include a gate electrode connected to the first control node NQ1, a first electrode configured to receive the second low gate voltage VGL2, and a second electrode connected to the second inversion control node NQB2. The 11th transistor T11 may provide the second low gate voltage VGL2 to the second inversion control node NQB2 in response to the voltage of the first control node NQ1. In an embodiment, the 11th transistor T11 may further include a back gate electrode connected to the gate electrode of the 11th transistor T11.

The control circuit 210 may further include second transistors T2_1 and T2_2 and third transistors T3_1 and T3_2.

The second transistors T2_1 and T2_2 may include a gate electrode configured to receive a reset signal ESR, a first electrode configured to receive the first low gate voltage VGL, and a second electrode connected to the first control node NQ1. The second transistors T2_1 and T2_2 may provide the first low gate voltage VGL to the first control node NQ1 in response to the reset signal ESR. The first control node NQ1 may be reset to the first low gate voltage VGL. In an embodiment, the second transistors T2_1 and T2_2 may further include a back gate electrode connected to the gate electrode of the second transistors T2_1 and T2_2. In an embodiment, the second transistors T2_1 and T2_2 may include a second-1 transistor T2_1 and a second-2 transistor T2_2 which are connected in series and have gate electrodes connected to each other.

The third transistors T3_1 and T3_2 may include a gate electrode connected to the first control node NQ1, a first electrode configured to receive a high gate voltage VGH, and a second electrode. The second electrode of the third transistors T3_1 and T3_2 may be connected to an intermediate node of the first transistors T1_1 and T1_2 and an intermediate node of the second transistors T2_1 and T2_2. The third transistors T3_1 and T3_2 may provide the high gate voltage VGH to the intermediate node of the first transistors T1_1 and T1_2 and the intermediate node of the second transistors T2_1 and T2_2 in response to the voltage of the first control node NQ1. Thus, the third transistors T3_1 and T3_2 may prevent the first transistors T1_1 and T1_2 and the second transistors T2_1 and T2_2 from being deteriorated. In an embodiment, the third transistors T3_1 and T3_2 may include a third-1 transistor T3_1 and a third-2 transistor T3_2 which are connected in series and have gate electrodes connected to each other.

The node separation transistor TL may be connected between the first control node NQ1 and a second control node NQ2. The node separation transistor TL may separate the first control node NQ1 and the second control node NQ2 to control the voltage of the first control node NQ1. The node separation transistor TL may include a gate electrode configured to receive the high gate voltage VGH, a first electrode connected to the first control node NQ1, and a second electrode connected to the second control node NQ2. The node separation transistor TL may be an Always-On Transistor (AOT). Since the second clock signal CLK2, the third clock signal CLK3, and the fourth clock signal CLK4 periodically toggle, the voltage of the second control node NQ2 may fluctuate. When the first control node NQ1 and the second control node NQ2 are separated from each other by the node separation transistor TL, the voltage of the first control node NQ1 may not fluctuate even though the voltage of the second control node NQ2 fluctuates.

The carry output circuit 220 may receive the fourth clock signal CLK4. The carry output circuit 220 may include a 15th transistor T15, a 16th transistor T16, a 12th transistor T12, a 13th transistor T13, and a third capacitor C3.

The 15th transistor T15 may include a gate electrode connected to the second control node NQ2, a first electrode configured to receive the fourth clock signal 4CLK4, and a second electrode connected to a carry output node NCR. The carry signal CR[N] may be output from the carry output node NCR. The 15th transistor T15 may provide the fourth clock signal CLK4 to the carry output node NCR in response to the voltage of the second control node NQ2. In an embodiment, the 15th transistor T15 may further include a back gate electrode connected to the gate electrode of the 15th transistor T15.

The 16th transistor T16 may include a gate electrode connected to the first inversion control node NQB1, a first electrode configured to receive the second low gate voltage VGL2, and a second electrode connected to the carry output node NCR. The 16th transistor T16 may provide the second low gate voltage VGL2 to the carry output node NCR in response to the voltage of the first inversion control node NQB1. In an embodiment, the 16th transistor T16 may further include a back gate electrode connected to the first electrode of the 16th transistor T16.

The 12th transistor T12 may include a gate electrode configured to receive the fourth clock signal CLK4, a first electrode connected to the first control node NQ1, and a second electrode. The 12th transistor T12 may provide the voltage of the first control node NQ1 to the second electrode of the 12th transistor T12 in response to the fourth clock signal CLK4.

The 13th transistor T13 may include a gate electrode connected to the first inversion control node NQB1, a first electrode connected to the second electrode of the 12th transistor T12, and a second electrode connected to the carry output node NCR. The 13th transistor T13 may provide the voltage of the first control node NQ1 provided by the 12th transistor T12 to the carry output node NCR in response to the voltage of the first inversion control node NQB1.

The third capacitor C3 may include a first electrode connected to the second control node NQ2 and a second electrode connected to the carry output node NCR. The third capacitor C3 may reduce a distorted waveform of the carry signal CR[N].

The carry output circuit 220 may further include a 17th transistor T17 and a 14th transistor T14.

The 17th transistor T17 may include a gate electrode connected to the second inversion control node NQB2, a first electrode configured to receive the second low gate voltage VGL2, and a second electrode connected to the carry output node NCR. The 17th transistor T17 may provide the second low gate voltage VGL2 to the carry output node NCR in response to the voltage of the second inversion control node NQB2. In an embodiment, the 17th transistor T17 may include a back gate electrode connected to the first electrode of the 17th transistor T17.

The 14th transistor T14 may include a gate electrode connected to the second inversion control node NQB2, a first electrode connected to the second electrode of the 12th transistor T12, and a second electrode connected to the carry output node NCR. The 14th transistor T14 may provide the voltage of the first control node NQ1 provided by the 12th transistor T12 to the carry output node NCR in response to the voltage of the second inversion control node NQB2.

The gate output circuits 230A, 230B, and 230C may include a first gate output circuit 230A and a second gate output circuit 230B.

The first gate output circuit 230A may receive the second carry clock signal CLK2. The first gate output circuit 230A may include an 18Ath transistor T18A and a 19Ath transistor T19A.

The 18Ath transistor T18A may include a gate electrode connected to the second control node NQ2, a first electrode configured to receive the second clock signal CLK2, and a second electrode connected to a first gate output node NGS1. The first gate signal GS[3N-2] may be output from the first gate output node NGS1. The 18Ath transistor T18A may provide the second clock signal CLK2 to the first gate output node NGS1 in response to the voltage of the second control node NQ2. In an embodiment, the 18Ath transistor T18A may further include a back gate electrode connected to the gate electrode of the 18Ath transistor T18A.

The 19Ath transistor T19A may include a gate electrode connected to the first inversion control node NQB1, a first electrode configured to receive the first low gate voltage VGL, and a second electrode connected to the first gate output node NGS1. The 19Ath transistor T19A may provide the first low gate voltage VGL to the first gate output node NGS1 in response to the voltage of the first inversion control node NQB1.

The first gate output circuit 230A may further include a 20Ath transistor T20A.

The 20Ath transistor T20A may include a gate electrode connected to the second inversion control node NQB2, a first electrode configured to receive the first low gate voltage VGL, and a second electrode connected to the first gate output node NGS1. The 20Ath transistor T20A may provide the first low gate voltage VGL to the first gate output node NGS1 in response to the voltage of the second inversion control node NQB2.

The second gate output circuit 230B may receive the third clock signal CLK3. The second gate output circuit 230B may include an 18Bth transistor T18B and a 19Bth transistor T19B.

The 18Bth transistor T18B may include a gate electrode connected to the second control node NQ2, a first electrode configured to receive the third clock signal CLK3, and a second electrode connected to a second gate output node NGS2. The second gate signal GS[3N-1] may be output from the second gate output node NGS2. The 18Bth transistor T18B may provide the third clock signal CLK3 to the second gate output node NGS2 in response to the voltage of the second control node NQ2. In an embodiment, the 18Bth transistor T18B may further include a back gate electrode connected to the gate electrode of the 18Bth transistor T18B.

The 19Bth transistor T19B may include a gate electrode connected to the first inversion control node NQB1, a first electrode configured to receive the first low gate voltage VGL, and a second electrode connected to the second gate output node NGS2. The 19Bth transistor T19B may provide the first low gate voltage VGL to the second gate output node NGS2 in response to the voltage of the first inversion control node NQB1.

The second gate output circuit 230B may further include a 20Bth transistor T20B.

The 20Bth transistor T20B may include a gate electrode connected to the second inversion control node NQB2, a first electrode configured to receive the first low gate voltage VGL, and a second electrode connected to the second gate output node NGS2. The 20Bth transistor T20B may provide the first low gate voltage VGL to the second gate output node NGS2 in response to the voltage of the second inversion control node NQB2.

The gate output circuits 230A, 230B, and 230C may further include a third gate output circuit 230C.

The third gate output circuit 230C may receive the fourth clock signal CLK4. The third gate output circuit 230C may include an 18Cth transistor T18C and a 19Cth transistor T19C.

The 18Cth transistor T18C may include a gate electrode connected to the second control node NQ2, a first electrode configured to receive the fourth clock signal CLK4, and a second electrode connected to a third gate output node NGS3. The third gate signal GS[3N] may be output from the third gate output node NGS3. The 18Cth transistor T18C may provide the fourth clock signal CLK4 to the third gate output node NGS3 in response to the voltage of the second control node NQ2. In an embodiment, the 18Cth transistor T18C may further include a back gate electrode connected to the gate electrode of the 18Cth transistor T18C.

The 19Cth transistor T19C may include a gate electrode connected to the first inversion control node NQB1, a first electrode configured to receive the first low gate voltage VGL, and a second electrode connected to the third gate output node NGS3. The 19Cth transistor T19C may provide the first low gate voltage VGL to the third gate output node NGS3 in response to the voltage of the first inversion control node NQB1.

The third gate output circuit 230C may further include a 20Cth transistor T20C.

The 20Cth transistor T20C may include a gate electrode connected to the second inversion control node NQB2, a first electrode configured to receive the first low gate voltage VGL, and a second electrode connected to the third gate output node NGS3. The 20Cth transistor T20C may provide the first low gate voltage VGL to the third gate output node NGS3 in response to the voltage of the second inversion control node NQB2.

In an embodiment, all of the transistors T1_1, T1_2, T2_1, T2_2, T3_1, T3_2, T4_1, T4_2, T5, T6, T7, T8_1, T8_2, T9, T10, T11, T12, T13, T14, T15, T16, T17, T18A, T18B, T18C, T19A, T19B, T19C, T20A, T20B, T20C, and TL included in each of the stage 200″ may be N-type transistors (e.g., NMOS transistors) or oxide transistors.

As described above, since the gate output circuits 230A, 230B and 230C share the control circuit 210, the node separation transistor TL, and the carry output circuit 220, the number of transistors and the number of signal lines in each of the stage 200 may decrease, and a dead space and power consumption of the display device 10 may decrease. In addition, each of the stage 200 includes the node separation transistor TL which separates the first control node NQ1 and the second control node NQ2, and thus reliability of the display device 10 may be improved.

Figure 11:
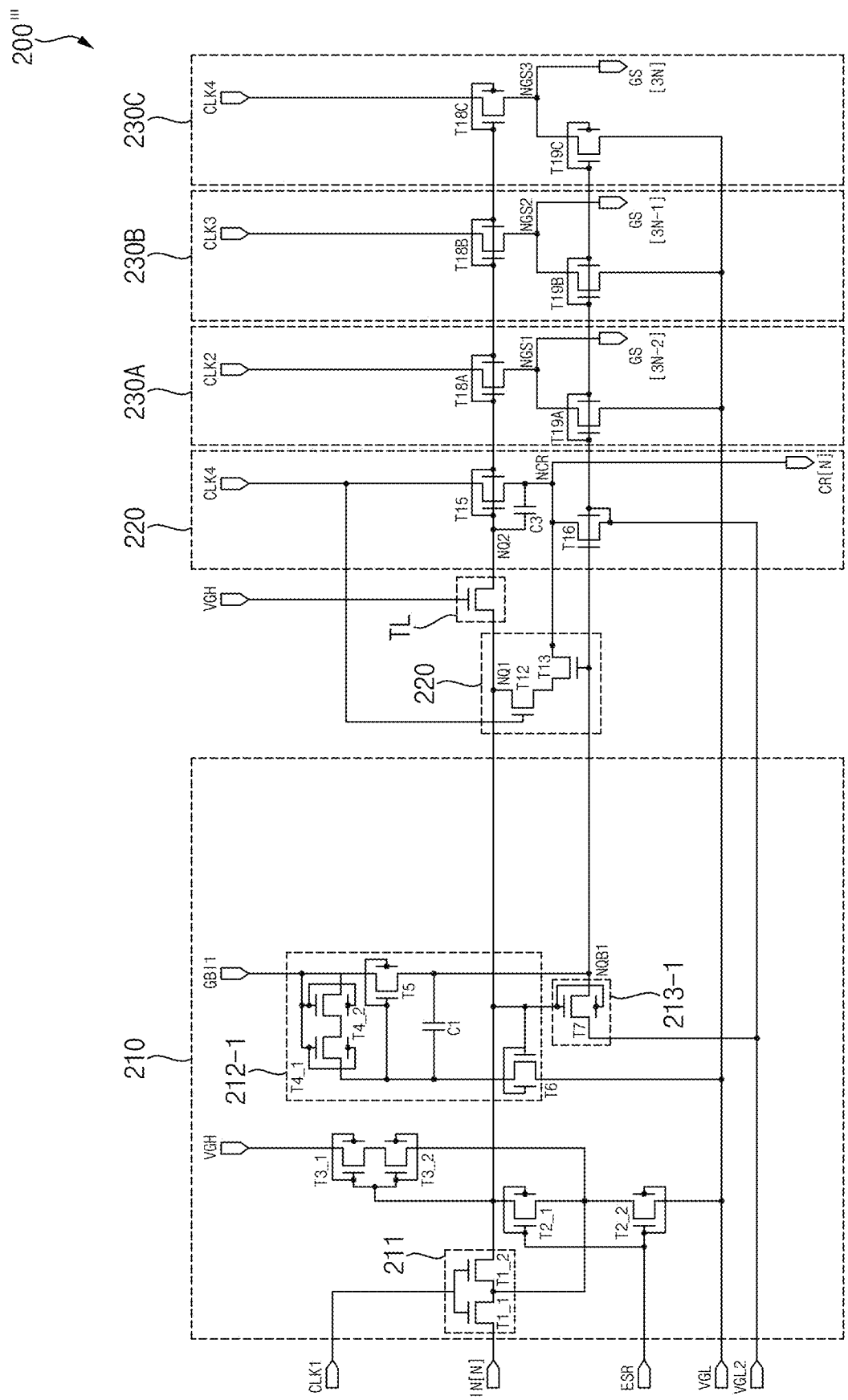
FIG. 11 is a circuit diagram showing a stage of the gate driver of FIG. 8.

FIG. 11 is a circuit diagram showing a stage 200‴ of the gate driver 130B of FIG. 8.

Each stage 200‴ in FIG. 11 is the same as each stage 200″ in FIG. 10 except for not including a second selection circuit 212-2, a second inversion control circuit 213-2, a 14th transistor T14 and a seventh transistor T17 of a carry output circuit 220, a 20Ath transistor T20A of a first gate output circuit 230A, a 20Bth transistor T20B of a second gate output circuit 230B, and a 20Cth transistor T20C of a third gate output circuit 230C, and thus the same reference numerals are used for the same or similar components, and redundant descriptions are omitted.

Referring to FIGS. 1 to 11, since the gate output circuits 230A, 230B, and 230C share a control circuit 210, a node separation transistor TL, and a carry output circuit 220, the number of transistors and the number of signal lines in each stage 200 may decrease, and a dead space and power consumption of the display device 10 may decrease. In addition, each of the stage 200‴ includes a node separation transistor TL which separates a first control node NQ1 and a second control node NQ2, and thus reliability of the display device 10 may be improved.

Figure 12:
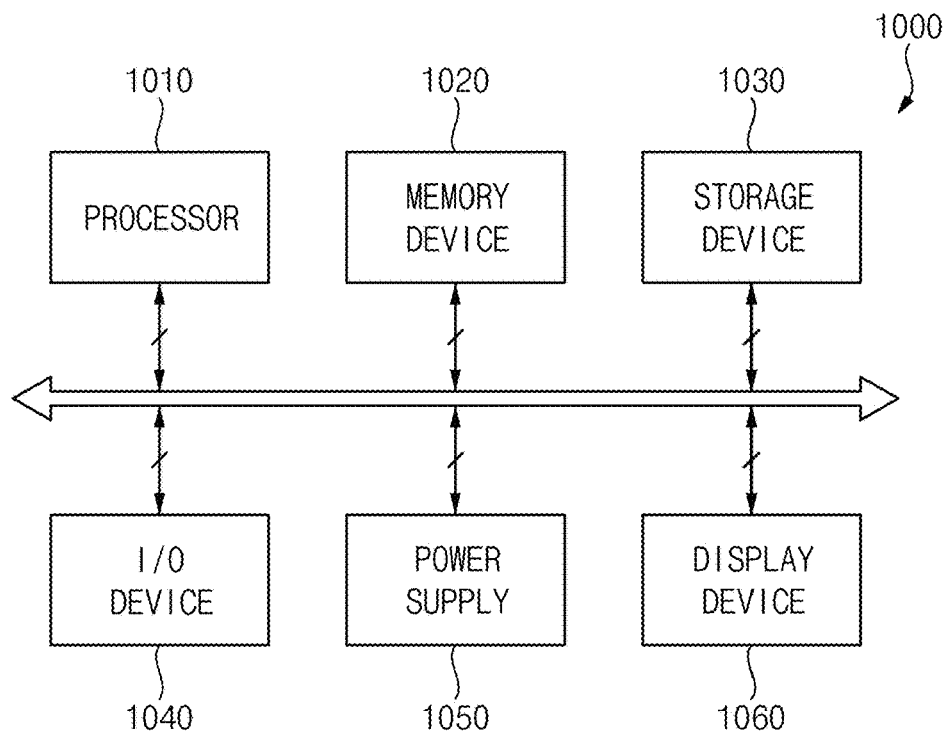
FIG. 12 is a block diagram illustrating an electronic device.
Figure 13:
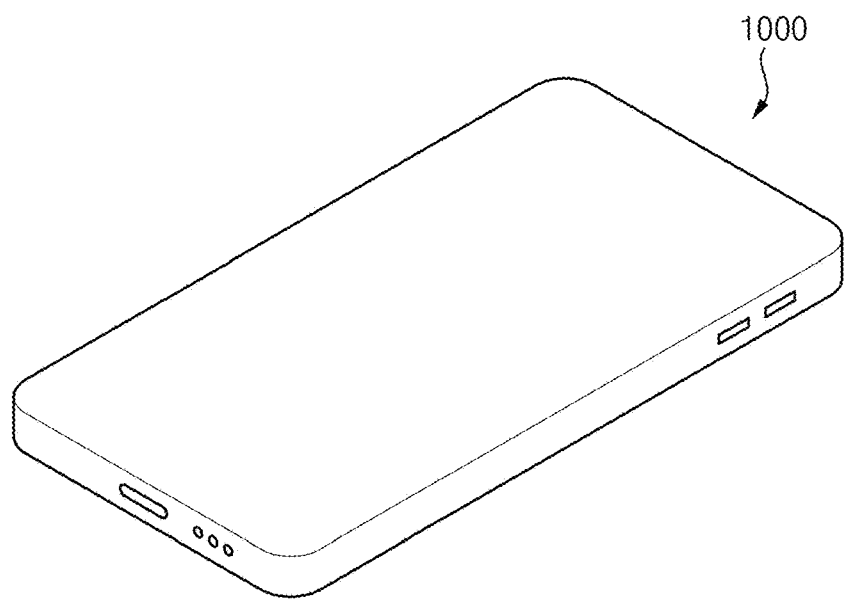
FIG. 13 is a diagram illustrating an embodiment in which the electronic device of FIG. 12 is implemented as a smart phone device.

FIG. 12 is a block diagram illustrating an electronic device 1000. FIG. 13 is a diagram illustrating an embodiment in which the electronic device 1000 of FIG. 12 is implemented as a smart phone device.

Referring to FIGS. 12 and 13, the electronic device 1000 may include a processor 1010, a memory device 1020, a storage device 1030, an input/output (I/O) device 1040, a power supply 1050, and a display device 1060. The display device 1060 may be the display device 10 of FIG. 1. In addition, the electronic device 1000 may further include a plurality of ports for communicating with a video card, a sound card, a memory card, a universal serial bus (USB) device, other electronic device, and the like.

In an embodiment, as illustrated in FIG. 13, the electronic device 1000 may be implemented as a smart phone. However, the electronic device 1000 is not limited thereto. For example, the electronic device 1000 may be implemented as a cellular phone, a video phone, a smart pad, a smart watch, a tablet PC, a car navigation system, a computer monitor, a laptop, a head mounted display (HMD) device, and the like.

The processor 1010 may perform various computing functions. The processor 1010 may be a micro-processor, a central processing unit (CPU), an application processor (AP), and the like. The processor 1010 may be coupled to other components via an address bus, a control bus, a data bus, and the like. Further, the processor 1010 may be coupled to an extended bus such as a peripheral component interconnection (PCI) bus.

The memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or at least one volatile memory device such as a dynamic random access memory (DRAM) device, a static random access memory (SRAM) device, a mobile DRAM device, and the like.

The storage device 1030 may include a solid state drive (SSD) device, a hard disk drive (HDD) device, a CD-ROM device, and the like.

The I/O device 1040 may include an input device such as a keyboard, a keypad, a mouse device, a touch-pad, a touch-screen, and the like, and an output device such as a printer, a speaker, and the like. In some embodiments, the I/O device 1040 may include the display device 1060.

The power supply 1050 may provide power for operations of the electronic device 1000.

The display device 1060 may be connected to other components through buses or other communication links.

The inventive concepts may be applied to any display device and any electronic device including the touch panel. For example, the inventive concepts may be applied to a mobile phone, a smart phone, a tablet computer, a digital television (TV), a 3D TV, a personal computer (PC), a home appliance, a laptop computer, a personal digital assistant (PDA), a portable multimedia player (PMP), a digital camera, a music player, a portable game console, a navigation device, etc.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific embodiments disclosed, and that modifications to the disclosed embodiments, as well as other embodiments, are intended to be included within the scope of the appended claims. The inventive concept is defined by the following claims, with equivalents of the claims to be included therein.

What is claimed is:

1. A gate driver comprising a plurality of stages, wherein at least one of the stages includes:
    a control circuit configured to control a first control node in response to a first carry clock signal;
    a node separation transistor connected between the first control node and a second control node;
    a carry output circuit configured to output a carry signal in response to a voltage of the second control node; and
    a plurality of gate output circuits configured to output a plurality of gate signals having different timings in response to the voltage of the second control node.

2. The gate driver of claim 1, wherein the node separation transistor separates the first control node and the second control node to control a voltage of the first control node.

3. The gate driver of claim 1, wherein the node separation transistor includes a gate electrode configured to receive a high gate voltage, a first electrode connected to the first control node, and a second electrode connected to the second control node.

4. The gate driver of claim 1, wherein the control circuit includes:
    an input circuit configured to provide an input signal to the first control node in response to the first carry clock signal;
    a first selection circuit configured to provide a first selection signal to a first inversion control node in response to the first selection signal; and
    a first inversion control circuit configured to control a voltage of the first inversion control node based on a voltage of the first control node.

5. The gate driver of claim 4, wherein the input circuit includes a first transistor including a gate electrode configured to receive the first carry clock signal, a first electrode configured to receive the input signal, and a second electrode connected to the first control node,
    wherein the first selection circuit includes a fourth transistor including a gate electrode configured to receive the first selection signal, a first electrode configured to receive the first selection signal, and a second electrode, a fifth transistor including a gate electrode connected to the second electrode of the fourth transistor, a first electrode configured to receive the first selection signal, and a second electrode connected to the first inversion control node, a sixth transistor including a gate electrode connected to the first control node, a first electrode configured to receive a first low gate voltage, and a second electrode connected to the gate electrode of the fifth transistor, and a first capacitor including a first electrode connected to the gate electrode of the fifth transistor and a second electrode connected to the first inversion control node, and
    wherein the first inversion control circuit includes a seventh transistor including a gate electrode connected to the first control node, a first electrode configured to receive a second low gate voltage, and a second electrode connected to the first inversion control node.

6. The gate driver of claim 4, wherein the control circuit further includes:
    a second selection circuit configured to provide a second selection signal to a second inversion control node in response to the second selection signal; and
    a second inversion control circuit configured to control a voltage of the second inversion control node based on the voltage of the first control node.

7. The gate driver of claim 6, wherein the second selection circuit includes:
    an eighth transistor including a gate electrode configured to receive the second selection signal, a first electrode configured to receive the second selection signal, and a second electrode;
    a ninth transistor including a gate electrode connected to the second electrode of the eighth transistor, a first electrode configured to receive the second selection signal, and a second electrode connected to the second inversion control node;

a tenth transistor including a gate electrode connected to the first control node, a first electrode configured to receive a first low gate voltage, and a second electrode connected to the gate electrode of the ninth transistor; and a second capacitor including a first electrode connected to the gate electrode of the ninth transistor and a second electrode connected to the second inversion control node, and wherein the second inversion control circuit includes an 11th transistor including a gate electrode connected to the first control node, a first electrode configured to receive a second low gate voltage, and a second electrode connected to the second inversion control node.

8. The gate driver of claim 4, wherein the control circuit further includes:

a second transistor including a gate electrode configured to receive a reset signal, a first electrode configured to receive a first low gate voltage, and a second electrode connected to the first control node; and a third transistor including a gate electrode connected to the first control node, a first electrode configured to receive a high gate voltage, and a second electrode.

9. The gate driver of claim 1, wherein the carry output circuit includes:

a 15th transistor including a gate electrode connected to the second control node, a first electrode configured to receive a second carry clock signal, and a second electrode connected to a carry output node through which the carry signal is output;

a 16th transistor including a gate electrode connected to a first inversion control node, a first electrode configured to receive a second low gate voltage, and a second electrode connected to the carry output node;

a 12th transistor including a gate electrode configured to receive the second carry clock signal, a first electrode connected to the first control node, and a second electrode;

a 13th transistor including a gate electrode connected to the first inversion control node, a first electrode connected to the second electrode of the 12th transistor, and a second electrode connected to the carry output node; and a third capacitor including a gate electrode connected to the second control node and a second electrode connected to the carry output node.

10. The gate driver of claim 9, wherein the carry output circuit further includes:

a 17th transistor including a gate electrode connected to the second inversion control node, a first electrode configured to receive the second low gate voltage, and a second electrode connected to the carry output node; and a 14th transistor including a gate electrode connected to the second inversion control node, a first electrode connected to the second electrode of the 12th transistor, and a second electrode connected to the carry output node.

11. The gate driver of claim 1, wherein the gate output circuits include a first gate output circuit configured to output a first gate signal in response to the voltage of the second control node, a second gate output circuit configured to output a second gate signal in response to the voltage of the second control node, a third gate output circuit configured to output a third gate signal in response to the voltage of the second control node, and a fourth gate output circuit configured to output a fourth gate signal in response to the voltage of the second control node, wherein the first gate output circuit includes:

a 18Ath transistor including a gate electrode connected to the second control node, a first electrode configured to receive a second clock signal, and a second electrode connected to a first gate output node through which the first gate signal is output; and a 19Ath transistor including a gate electrode connected to a first inversion control node, a first electrode configured to receive a first low gate voltage, and a second electrode connected to the first gate output node, wherein the second gate output circuit includes:

a 18Bth transistor including a gate electrode connected to the second control node, a first electrode configured to receive a third clock signal, and a second electrode connected to a second gate output node through which the second gate signal is output; and a 19Bth transistor including a gate electrode connected to the first inversion control node, a first electrode configured to receive the first low gate voltage, and a second electrode connected to the second gate output node, wherein the third gate output circuit includes:

a 18Cth transistor including a gate electrode connected to the second control node, a first electrode configured to receive a fourth clock signal, and a second electrode connected to a third gate output node through which the third gate signal is output; and a 19Cth transistor including a gate electrode connected to the first inversion control node, a first electrode configured to receive the first low gate voltage, and a second electrode connected to the third gate output node, and wherein the fourth gate output circuit includes:

a 18Dth transistor including a gate electrode connected to the second control node, a first electrode configured to receive a fifth clock signal, and a second electrode connected to a fourth gate output node through which the fourth gate signal is output; and a 19Dth transistor including a gate electrode connected to the first inversion control node, a first electrode configured to receive the first low gate voltage, and a second electrode connected to the fourth gate output node.

12. The gate driver of claim 11, wherein the first gate output circuit further includes a 20Ath transistor including a gate electrode connected to a second inversion control node, a first electrode configured to receive the first low gate voltage, and a second electrode connected to the first gate output node, wherein the second gate output circuit further includes a 20Bth transistor including a gate electrode connected to the second inversion control node, a first electrode configured to receive the first low gate voltage, and a second electrode connected to the second gate output node, wherein the third gate output circuit further includes a 20Cth transistor including a gate electrode connected to the second inversion control node, a first electrode configured to receive the first low gate voltage, and a second electrode connected to the third gate output node, and wherein the fourth gate output circuit further includes a 20Dth transistor including a gate electrode connected to the second inversion control node, a first electrode configured to receive the first low gate voltage, and a second electrode connected to the fourth gate output node.

13. A gate driver comprising a plurality of stages, wherein at least one of the stages includes:
a control circuit configured to control a first control node in response to a first clock signal;
a node separation transistor connected between the first control node and a second control node;
a carry output circuit configured to output a carry signal in response to a voltage of the second control node; and
a plurality of gate output circuits configured to output a plurality of gate signals having different timings in response to the voltage of the second control node.

14. The gate driver of claim 13, wherein the node separation transistor separates the first control node and the second control node to control a voltage of the first control node.

15. The gate driver of claim 13, wherein the node separation transistor includes a gate electrode configured to receive a high gate voltage, a first electrode connected to the first control node, and a second electrode connected to the second control node.

16. The gate driver of claim 13, wherein the control circuit includes an input circuit configured to provide an input signal to the first control node in response to the first clock signal, a first selection circuit configured to provide the first selection signal to a first inversion control node in response to a first selection signal, and a first inversion control circuit configured to control a voltage of the first inversion control node based on a voltage of the first control node,
wherein the input circuit includes a first transistor including a gate electrode configured to receive the first clock signal, a first electrode configured to receive the input signal, and a second electrode connected to the first control node,
wherein the first selection circuit includes a fourth transistor including a gate electrode configured to receive the first selection signal, a first electrode configured to receive the first selection signal, and a second electrode, a fifth transistor including a gate electrode connected to the second electrode of the fourth transistor, a first electrode configured to receive the first selection signal, and a second electrode, a sixth transistor including a gate electrode connected to the first control node, a first electrode configured to receive a first low gate voltage, and a second electrode connected to the gate electrode of the fifth transistor, and a first capacitor including a first electrode connected to the gate electrode of the fifth transistor and a second electrode connected to the first inversion control node, and
wherein the first inversion control circuit includes a seventh transistor including a gate electrode connected to the first control node, a first electrode configured to receive a second low gate voltage, and a second electrode connected to the first inversion control node.

17. The gate driver of claim 16, wherein the control circuit further includes a second selection circuit configured to provide a second selection signal to a second inversion control node in response to the second selection signal, and a second inversion control circuit configured to control a voltage of the second inversion control node based on the voltage of the first control node,
wherein the second selection circuit includes:
an eighth transistor including a gate electrode configured to receive the second selection signal, a first electrode configured to receive the second selection signal, and a second electrode;
a ninth transistor including a gate electrode connected to the second electrode of the eighth transistor, a first electrode configured to receive the second selection signal, and a second electrode;
a tenth transistor including a gate electrode connected to the first control node, a first electrode configured to receive a first low gate voltage, and a second electrode connected to the gate electrode of the ninth transistor; and
a second capacitor including a first electrode connected to the gate electrode of the ninth transistor and a second electrode connected to the second inversion control node, and
wherein the second inversion control circuit includes an 11th transistor including a gate electrode connected to the first control node, a first electrode configured to receive a second low gate voltage, and a second electrode connected to the second inversion control node.

18. The gate driver of claim 13, wherein the carry output circuit includes:
a 15th transistor including a gate electrode connected to the second control node, a first electrode configured to receive a fourth clock signal, and a second electrode connected to a carry output node through which the carry signal is output;
a 16th transistor including a gate electrode connected to the first inversion control node, a first electrode configured to receive a second low gate voltage, and a second electrode connected to the carry output node;
a 12th transistor including a gate electrode configured to receive the fourth clock signal, a first electrode connected to the first control node, and a second electrode;
a 13th transistor including a gate electrode connected to the first inversion control node, a first electrode connected to the second electrode of the 12th transistor, and a second electrode connected to the carry output node; and
a third capacitor including a first electrode connected to the second control node and a second electrode connected to the carry output node.

19. The gate driver of claim 18, wherein the carry output circuit further includes:
a 17th transistor including a gate electrode connected to the second inversion control node, a first electrode configured to receive the second low gate voltage, and a second electrode connected to the carry output node; and
a 14th transistor including a gate electrode connected to the second inversion control node, a first electrode connected to the second electrode of the 12th transistor, and a second electrode connected to the carry output node.

20. The gate driver of claim 13, wherein the gate output circuits include a first gate output circuit configured to output a first gate signal in response to the voltage of the second control node, a second gate output circuit configured to output a second gate signal in response to the voltage of the second control node, and a third gate output circuit configured to output a third gate signal in response to the voltage of the second control node,
wherein the first gate output circuit includes:
a 18Ath transistor including a gate electrode connected to the second control node, a first electrode configured to receive a second clock signal, and a second electrode connected to a first gate output node through which the first gate signal is output; and a 19Ath transistor including a gate electrode connected to a first inversion control node, a first electrode configured to receive a first low gate voltage, and a second electrode connected to the first gate output node, wherein the second gate output circuit includes:

a 18Bth transistor including a gate electrode connected to the second control node, a first electrode configured to receive a third clock signal, and a second electrode connected to a second gate output node through which the second gate signal is output; and a 19Bth transistor including a gate electrode connected to the first inversion control node, a first electrode configured to receive the first low gate voltage, and a second electrode connected to the second gate output node, and wherein the third gate output circuit includes:

a 18Cth transistor including a gate electrode connected to the second control node, a first electrode configured to receive a fourth clock signal, and a second electrode connected to a third gate output node through which the third gate signal is output; and a 19Cth transistor including a gate electrode connected to the first inversion control node, a first electrode configured to receive the first low gate voltage, and a second electrode connected to the third gate output node.

21. The gate driver of claim 20, wherein the first gate output circuit further includes:

a 20Ath transistor including a gate electrode connected to a second inversion control node, a first electrode configured to receive the first low gate voltage, and a second electrode connected to the first gate output node, wherein the second gate output circuit further includes:

a 20Bth transistor including a gate electrode connected to the second inversion control node, a first electrode configured to receive the first low gate voltage, and a second electrode connected to the second gate output node, and wherein the third gate output circuit further includes:

a 20Cth transistor including a gate electrode connected to the second inversion control node, a first electrode configured to receive the first low gate voltage, and a second electrode connected to the third gate output node.

* * * * *